United States Patent [19]

Burrows

[11] Patent Number: 5,914,679
[45] Date of Patent: Jun. 22, 1999

[54] METHOD FOR ENCODING DELTA VALUES

[75] Inventor: Michael Burrows, Palo Alto, Calif.

[73] Assignee: Digital Equipment Corporation, Maynard, Mass.

[21] Appl. No.: 09/032,826

[22] Filed: Feb. 27, 1998

Related U.S. Application Data

[63] Continuation of application No. 08/695,059, Aug. 9, 1996, Pat. No. 5,724,033.

[51] Int. Cl.⁶ ..................................................... H03M 3/00
[52] U.S. Cl. ................................................. 341/76; 341/77
[58] Field of Search ..................................... 341/76.77, 87

[56] References Cited

U.S. PATENT DOCUMENTS

| | | | |
|---|---|---|---|
| 4,719,642 | 1/1988 | Lucas | 375/30 |
| 5,467,134 | 11/1995 | Laney et al. | 348/409 |

*Primary Examiner*—Brian Young
*Assistant Examiner*—Peguy Jean Pierre
*Attorney, Agent, or Firm*—Jenkens & Gilchrist, P.C.

[57] ABSTRACT

In a computer implemented method for encoding digital values that are arranged in a successively increasing order, a delta value is determined for each pair of immediately successive values. The delta values are the differences between the pair of immediately successive values. For each delta value which can be encoded as a single byte, a logical zero is stored in the least significant bit of the single byte, and the delta value is stored in the most significant bits of the single byte. Otherwise, for each delta value which must be encoded as a plurality of bytes, a logical one is stored in the least significant bit of the first byte of the plurality of bytes, and a first portion of the delta value is stored in the most significant bits of the first byte. In this case, a logical zero is stored in the most significant bit of the next byte, and a next portion of the delta value is stored in the least significant bits of the next byte. If the next portion is the last portion of the delta value, a logical zero is stored in the most significant bit of the last byte, and the last portion of the delta value is stored in the least significant bits of the last byte.

39 Claims, 26 Drawing Sheets

METHOD FOR ENCODING DELTA VALUES

CROSS REFERENCE TO RELATED APPLICATIONS

This application is a continuation of application Ser. No. 08/695,059 filed on Aug. 9, 1996, now U.S. Pat. No. 5,724,033.

FIELD OF THE INVENTION

This invention relates generally to encoding digital values, and more particularly to encoding values which are sequentially ordered.

BACKGROUND OF THE INVENTION

In the prior art, it has been well known that computer systems can be used to encode digital values in order to reduce storage requirements. There are many techniques for encoding digital values.

For values which are arranged sequentially, for example, in an ascending order, the differences between successive values can be encoded. This is called delta value encoding. For delta encoding to be effective, small delta values should be stored in a small number of bytes. Having variable length delta encodings makes the decoding more complex, since the end of each decoding must be detected.

Another problem with delta value encoding is that in order to decode any given value, all previous values must be decoded. This can consume a large number of processor cycles. The number of cycles consumed can be very large if the number of delta values to be decoded is in the hundreds of millions.

This situation can exists in an index to a unique distributed database which has recently emerged in the form of the World-Wide-Web (Web). The database records of the Web are in the form of pages accessible via the Internet. Here, tens of millions of pages are accessible by anyone having a communications link to the Internet. Each page can include many thousands of words.

A full word index to the Web pages may have many pointers to words of the pages. For example, the word "the" appears at well over 300,000,000 different locations. If the pointers are maintained sequentially, then the pointers can be delta encoded.

A procedure of ten instructions which takes 10 cycles to decode a delta value will be twice as fast as a procedure which requires 20 cycles. For the decoding of millions of delta values per second, eliminating even a single instruction from the procedure will have a significant payback.

Therefore it is desired to prove a delta encoding which minimizes storage and decoding time.

SUMMARY OF THE INVENTION

A computer implemented method encodes digital values that are arranged in a successively increasing order into a compressed form in order to minimize the number of instructions which must be executed to decode the encoded values.

The method determines a delta value for each pair of immediately successive values. Each delta value is the difference between the pair of immediately successive values. For each delta value which can be encoded as a single byte, a logical zero is stored in the least significant bit of the single byte, and the delta value is stored in the most significant bits of the single byte.

Otherwise, if the delta value must be stored as multiple bytes, then a logical one is stored in the least significant bit of the first byte, and the first portion of the delta value is stored in the most significant bits of the first byte. A logical zero is stored in the most significant bit of the following bytes, and the next portions of the delta values are stored in the least significant bits of the following bytes. However, for the last portion of the delta value, a logical zero is stored in the most significant bit of the last byte, and the last portion of the delta value is stored in the least significant bits of the last byte.

DETAILED DESCRIPTION OF PREFERRED EMBODIMENTS

Introduction

Figure 1:
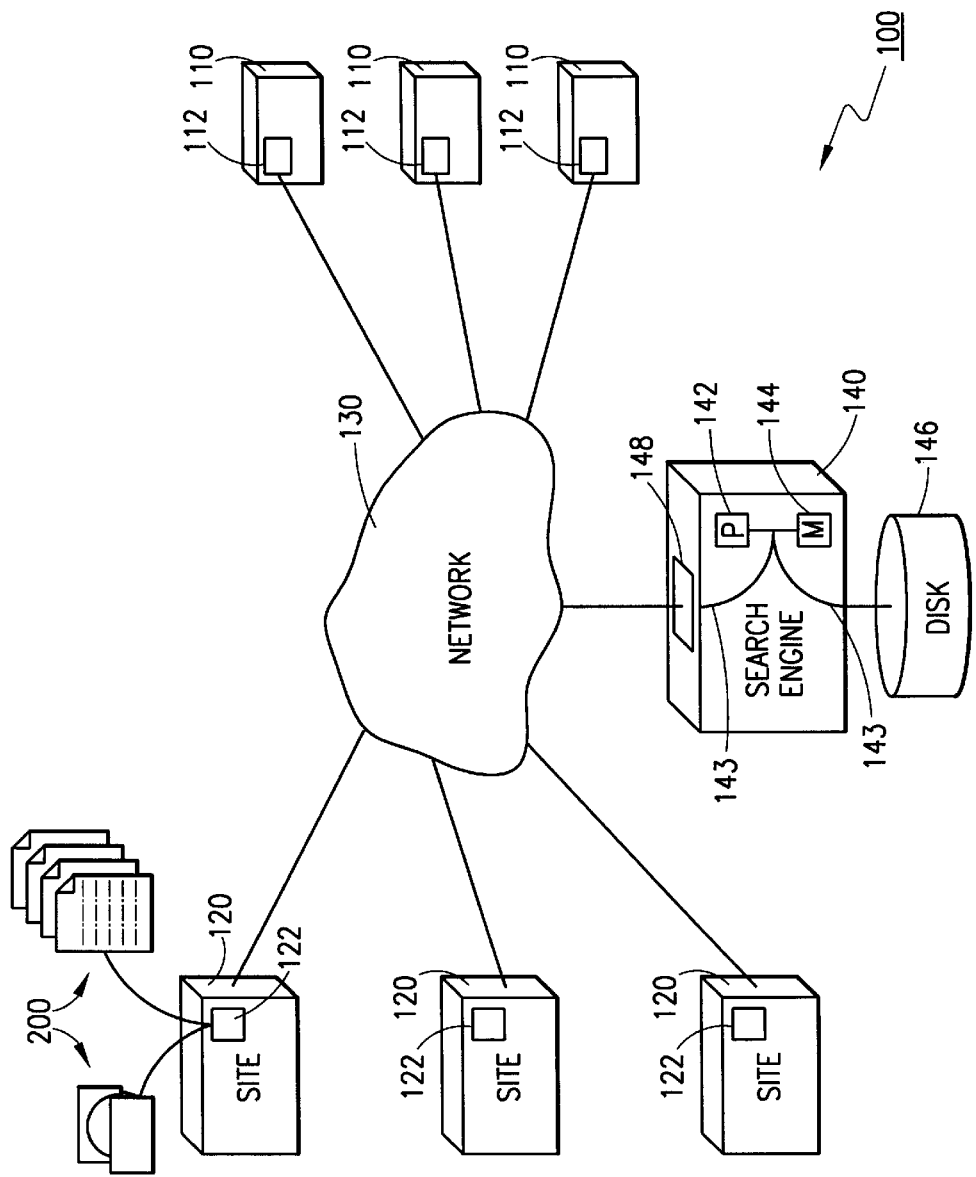
FIG. 1 is a block diagram of a distributed database storing multimedia information indexed and searched according to the invention.

FIG. 1 shows a distributed computer system 100 including a database to be indexed. The distributed system 100 includes client computers 110 connected to server computers (sites) 120 via a network 130. The network 130 can use Internet communications protocols (IP) to allow the clients 110 to communicate with the servers 120.

The client computers 110 can be PCs, workstations, or larger or smaller computer systems. Each client 110 typically includes one or more processors, memories, and input/output devices. The servers 120 can be similarly configured. However, in many instances server sites 120 include many computers, perhaps connected by a separate private network. In fact, the network 130 may include hundreds of thousands of individual networks of computers.

Although the client computers 110 are shown separate from the server computers 120, it should be understood that a single computer can perform the client and server roles.

During operation of the distributed system 100, users of the clients 110 desire to access information records 122 stored by the servers 120 using, for example, the World Wide Web (WWW), or in short the "Web." The records of information 122 can be in the form of Web pages 200. The pages 200 can be data records including as content plain textual information, or more complex digitally encoded multimedia content, such as software programs, graphics, audio signals, videos, and so forth.

It should be understood that although this description focusses on locating information on the World Wide Web, the system can also be used for locating and indexing information via other wide or local area networks (WANs and LANs), or information stored in a single computer using other communications protocols.

The clients 110 can execute Web browser programs 112, such as NAVIGATOR, EXPLORER or MOSAIC to locate the pages or records 200. The browser programs 112 allow the users to enter addresses of specific Web pages 200 to be retrieved. Typically, the address of a Web page is specified as a Universal Resource Locator (URL). In addition, once a page has been retrieved, the browser programs 112 can provide access to other pages or records by "clicking" on hyperlinks to previously retrieved Web pages. Such hyperlinks provide an automated way to enter the URL of another page, and to retrieve that page.

In order to identify pages of interest among the millions of pages which are available on the Web, a search engine 140 is provided. The search engine 140 includes means for parsing the pages, means for indexing the parsed pages, means for searching the index, and means for presenting information about the pages 200 located.

The search engine 140 can be configured as one or more clusters of symmetric multi-processors (P) 142, for example, Digital Equipment Corporation ALPHA processors, memories (M) 144, disk storage devices 146, and network interfaces 148, which are connected to each other by high speed communications buses 143. Although, the ALPHA processors 142 are 64 bit RISC processors, the search engine 140 can be any type of processor which has sufficient processing power and memories, including 32 bit CISC processors. For smaller databases, the search engine can be run on the computer storing the database.

Search Engine Overview

Figure 2:
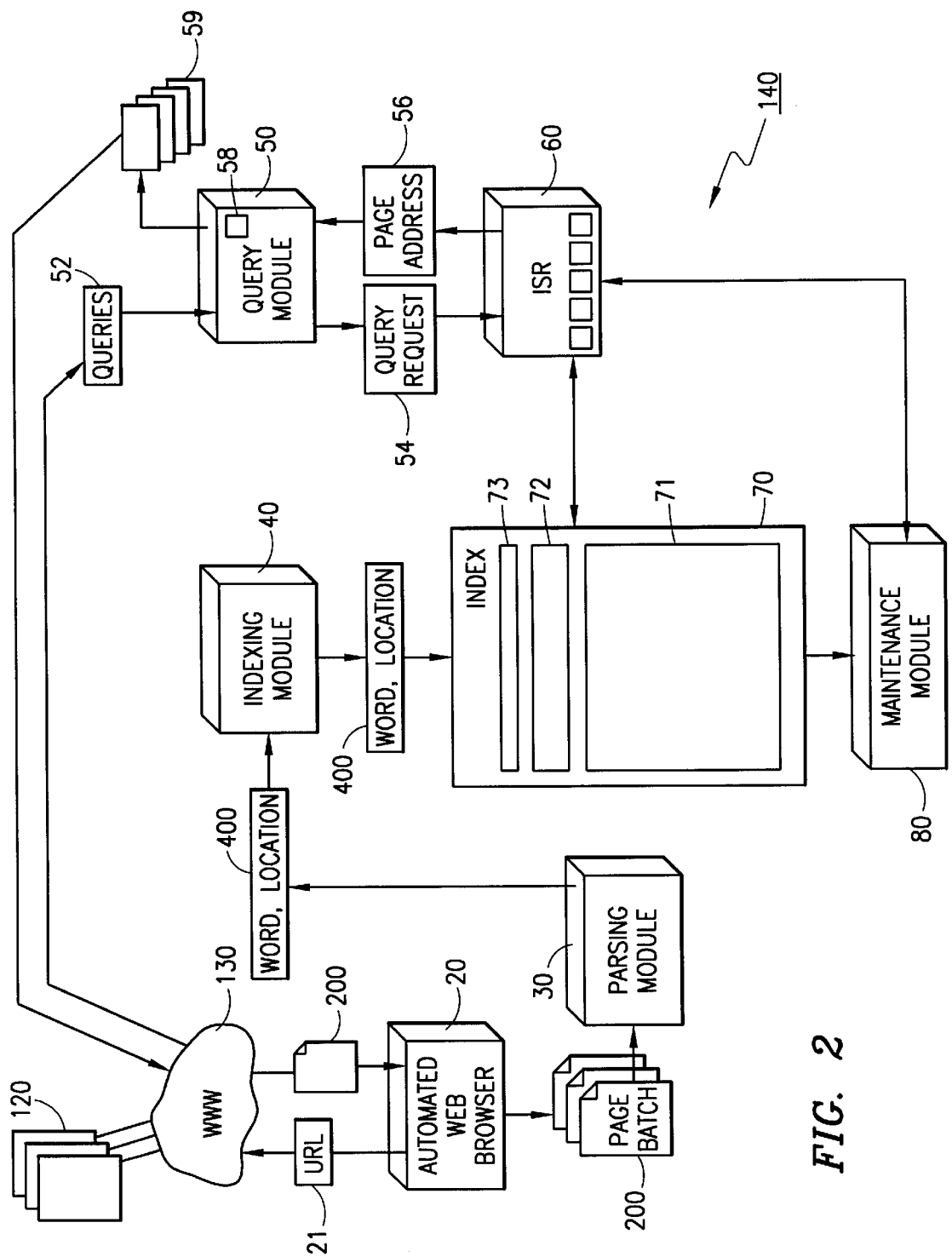
FIG. 2 is a block diagram of a search engine including an index.

FIG. 2 shows the components of the search engine 140. The search engine 140 can include an automated Web browser 20, a parsing module 30, an indexing module 40, a query module 50, index stream readers (ISR) 60, an index 70, and a maintenance module 80.

Browsing

During the operation of the search engine 140, the automated browser 20, sometimes known as a "robot," periodically sends out requests 21 over the network 130. The requests 21 include URLs. In response to the requests 21, the sites 120 return the records or pages 200 to the browser 20. The browser 20 can locate pages by following hyperlinks embedded in previously acquired pages. The browser 20 is described more completely in U.S. patent application Ser. No. 08/571,748 filed by Louis M. Monier on Dec. 13, 1995 entitled "System and Method for Locating Pages on the World Wide Web."

Parsing

The pages 200 can be presented to the parsing module 30 as they are received or in batches which may amount to ten thousand pages or more, at one time. The parsing module 30 breaks down the portions of information of the pages 200 into fundamental indexable elements or atomic pairs 400. As described in greater detail below, each pair 400 comprises a word and its location. The word is a literal representation of the parsed portion of information, the location is a numeric value. The pages are parsed in order of the location of the words such that a location of the first word of a next page follows a location of the last word of a previous page. The parsing module 30 assigns increasing integer numbers to the locations, although other sequential orderings are also possible.

Indexing

The indexing module 40 sorts the pairs 400, first in word order, and second in location order. The sorted pairs 400 are used to generate the index 70 of the words of the pages 200. The index 70 is described in greater detail below. Abstractly, the index 70 can be pictured as comprising compressed data structures 71, and summary data structures 72–73. The compressed data structure 71 is a compression of the word location pairs 400. The data structure 72 is a summary of the structure 71, and the data structure 73 is a summary of data structure 72. The structures 71 and 72 can be stored on disk, and the structure 73 can be stored in DRAM.

In the data structure 71, each word representing a unique portion of information of the pages 200 is stored only once. All of the locations which are instances of the word in the pages 200 are stored following the word. The locations follow the word in order according to their locations. The locations essentially are pointers to the parsed portions of information.

It should be understood that the number of different unique words can be well over one hundred million, since any combination of characters can form words of the pages 200. Also, many frequently occurring words, such as the words "the," "of," "a," etc., may appear at hundreds of millions of different locations. The extremely large size of the index 70, and its increasing size present special processing problems.

As described below, the data structures of the index 70 are optimized for query access. This means that the word-location pairs 400 are compressed to reduce storage, and uncompressing is minimized in order to preserve processor cycles during searching. Furthermore, the data structures of the index 70 also allow concurrent maintenance of the index 70 to delete old entries and to add new entries while queries are processed.

Querying

Users interact with the index 70 via the query module 50 by providing queries 52. Users can be located remotely or locally with respect to the search engine 140. The terms of a query can include words and phrases, e.g., multiple words inclosed in quotation marks ("). The terms can be related by Boolean operators such as OR, AND, and NOT to form expressions. The queries 52, as described in greater detail below, may also include terms which express ranges of values, or approximate locations of words to each other.

During operation, the query module 50 analyzes the queries 52 to generate query requests 54. The query requests invoke a small number of basic types of object-oriented index stream readers (ISRs) 60, described below. The index stream readers 60 sequentially scan the data structures 71–73 in a manner to minimize the amount of data that need to be uncompressed.

As a result of searching the index 70 by the stream reader objects 60, addresses 56 of pages which are qualified by the queries are identified. A presentation module 58 delivers information 59 about the qualifying pages to the users. The information 59 can include a summary of the pages located. Using the summary information, the users can access the identified pages with Web browsing software, or other techniques.

Maintaining

As described below, the maintenance module 80 is used to add and delete information of the index 70. Modified pages can be handled as a delete and add operation. A particular problem solved is to allow substantially continuous access to the index 70 by millions of users each day as the index 70 is concurrently updated. The maintenance module 80 also effectively deals with duplicate Web pages containing substantially identical content.

The components of the search engine 140 are now described in greater detail.

The Parsing Module

Words

Figure 3:
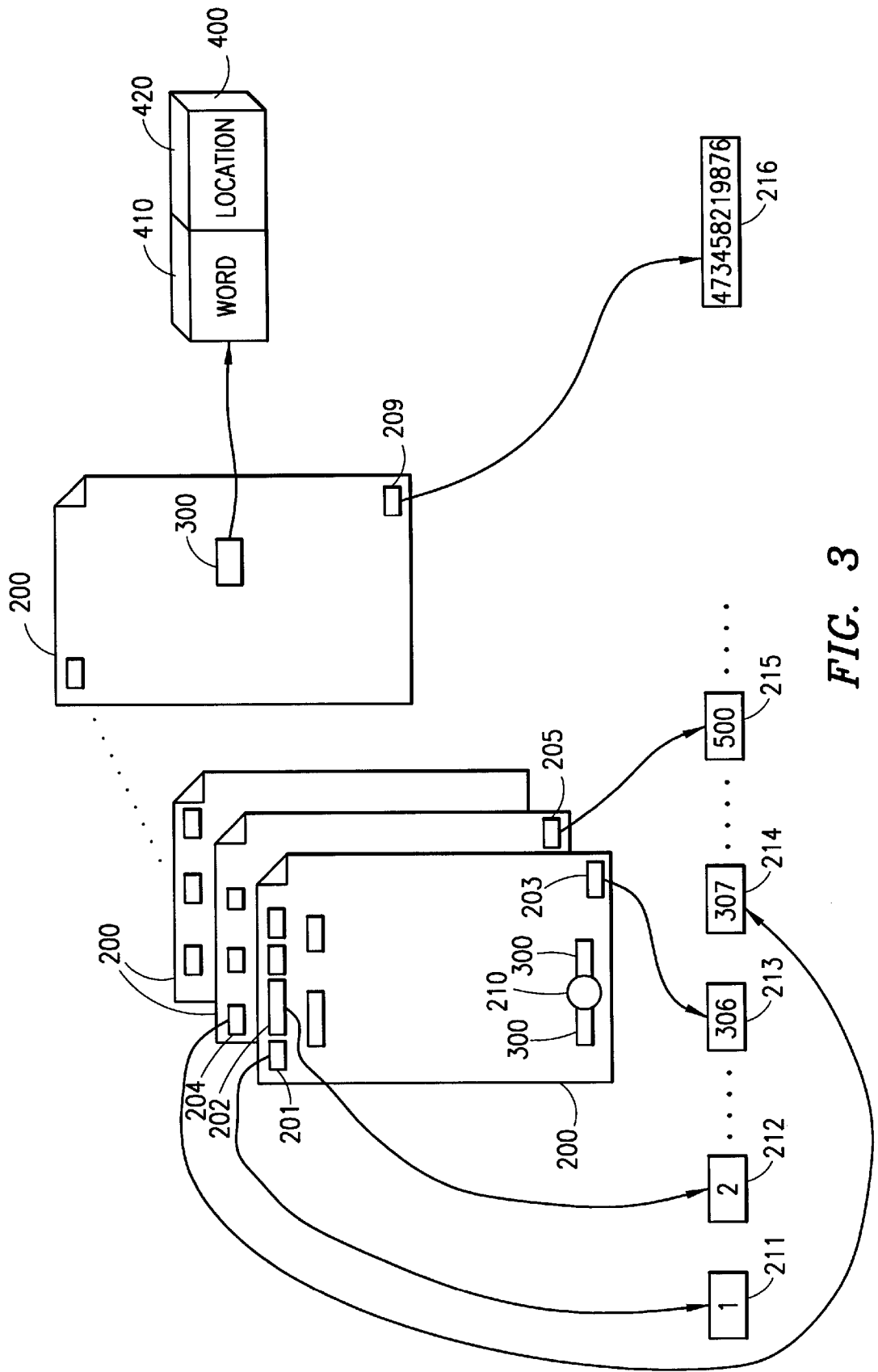
FIG. 3 is a block diagram of pages parsed by the search engine of FIG. 2.

As shown in FIG. 3, the records or pages 200 are parsed by the parsing module 30 in the order that pages are received from the browser 20. The parsing module 30, in a collating order of the sequential locations of the content, breaks the information of the pages 200 down into discrete indexable elements or individual "words" 300. Each word 300 is separated from adjacent words by a word separator 210 indicated by a circle. In the index 70 each word is stored as a "literal" or character based value. It should be understood, that the terms page 200, word 300, and separator 210 are used to represent many different possible content modalities and data record specifications.

Pages

A page 200 can be defined as a data record including a collection of portions of information or "words" having a common database address, e.g., a URL. This means that a page can effectively be a data record of any size, from a single word, to many words, e.g., a large document, a data file, a book, a program, or a sequence of images.

In addition, the digitized information which is stored by the records or pages 200 can represent a number of different presentation modalities. The page 200 can be expressed using the ASCII, or other character sets such as iconic, scientific, mathematical, musical, Hebrew, Cyrillic, Greek, Japanese.

On the Web, it has become common to represent information using a Hyper Text Markup Language (html). In this case, the pages can include other "marks" which indicate how the "words" of the page are to be processed and presented. Pages can include programs, for example JAVA applets, which may require specialized parsing. The information of some pages can be expressed in a programming language, for example, Postscript (.ps), or Acrobat (.pdf) files. The pages 200 can encode multimedia items including digitized graphic, audio or video components.

The pages or data records 200 do not necessarily need to be Web pages. For example, the pages can be composed of portions of information of other databases, for example, all of the case law in the United States. Even if such pages do contain hyperlinks, they may contain other types of links. In this context, the links mean references in one document which can be used to find other documents. Although hyperlinks are one example, many other types of links may be processed.

For example, in court cases, the "links" are citations to other cases. The "pages" can be the patents of the United States Patent and Trademark Office. Now the "links" can be the prior art references cited.

Additionally, the pages 200 can be electronic mail memos stored in PCs. For "audio" pages, the words may be composed of encoded phonemes. In any case, no matter what the modality of the underlying information, the words are always represented in the index as literals.

Word Separators

Textual words are a concatenation of numbers and characters, for example "the", and "ωombαTψ23." In one possible parsing technique, characters other than numbers or letters are considered word separators 210. For example, blanks and characters such as "@#.<?~,%" are word separators. Word separators 210 are not indexed.

It should be understood that the parsing module 30 can be provided with a first list of literal characters or marks which can form words, and a second list of marks, or other criteria, e.g., white space, which are to be considered as separators 210. Separate lists can be maintained in the search engine 140 for different types of pages.

In the cases where a programming language such as Postscript or Acrobat is used to represent information to be indexed, the parsing module 30 can detect word separation by the language instructions which are responsible for generating discrete words.

The parsing of the pages into words and locations can be context independent or context dependent. For example, if a page 200 is known to be expressed in a script where the location of words is in another collating order, for example, from right to left, or top to bottom, the parsing can proceed accordingly.

Word and Location Pairs

In summary, each page 200 is broken down into a sequence of pairs 400 according to the collating order of the locations of the words 300. Each pair 400 stores the word 410 and its the location 420. The locations of the words indicate the relative order in which the parsing module identified the words 300 in the pages 200.

Each page has a first word and a last word. For example in FIG. 3, the first word 201 of the very first page which is parsed has an associated location "1" 211, the next word 202 has a location "2" 212, the last word 203 has a location "306" 213. This means the first page has three-hundred and six indexable words.

The first word 204 of the second page has an associated location of "307" 214. The last word 205 of the second page has a location "500" 215. This means that second page includes 194 (500–306) words. From the perspective of the parsing module 30, the first word of a next page is considered to be positionally adjacent to the last word of a previous page. The last word 206 of the very last page that is parsed has, for example, a location "473458219876" 209.

The word 410 determines the value of the "content" at a particular location. As stated above, content can be represented in a variety of different modalities. For example, the word "a" may be expressed as a binary encoding of the ASCII value of "a." In one implementation, the locations 420 incrementally increase by one for each word parsed. Other sequential numbering schemes for locations can also be used.

Synonyms

Besides explicitly producing the pair [word, location] for each recognized word, the parser can also implicitly produce one or more synonymous pairs for expressly identified words. For example, if the identified word 201 on the first page is "To", in addition to producing the pair [1,To], the parsing module 30 can also produce, for the same location, the pair [1, to]. That is, the parsing module 30 produces two pairs for the same location. This step is useful to subsequently allow case insensitive searches by the query module 50. The parsing module 50 can also select synonyms from lists maintained in language translation dictionaries.

Punctuation

If the parsing module 30 admits non-alphanumeric characters in words, additional pairs may be produced for single locations. For example, the parsing module 30 can be directed to treat punctuation immediately adjacent to letters or numbers as part of the word. For example, if the second word 202 is a concatenation of the characters "5,234,236", "023-45-3678" or "Ph.D", the characters could very well be considered to form single words.

In the case of the value "Ph.D," the parsing module 30 can produce the pairs [2, Ph], [2,.] [3, D], and [2,ph], [2,.], [3,d] to facilitate searches where the input query is any sequence of characters substantially similar to the explicitly expressed words. This allows query phrases that are specified with both precise and imprecise punctuation marks.

Accents

Furthermore, the parsing module 30 can implicitly produce additional pairs for words which include accented characters. For example the word "Êcu" can also be indexed as values "êcu," "Ecu." and "ecu," all at the same location. This allows for the searching of pages expressed in characters of one alphabet using characters of another alphabet not necessarily including the accented characters. Thus for example, a user with an "American" style keyboard can search foreign language pages.

Proper Names

The parsing module can also locate words which are likely to be related, such as proper names, e.g., James Joyce. If two adjacent words both begin with an upper case letter, in addition to producing a pair for the first name and the last name, a pair can also be produced which is a concatenation of the first and last names. This will speed up processing of queries which include proper names as terms.

Attributes and Metawords

Figure 4:
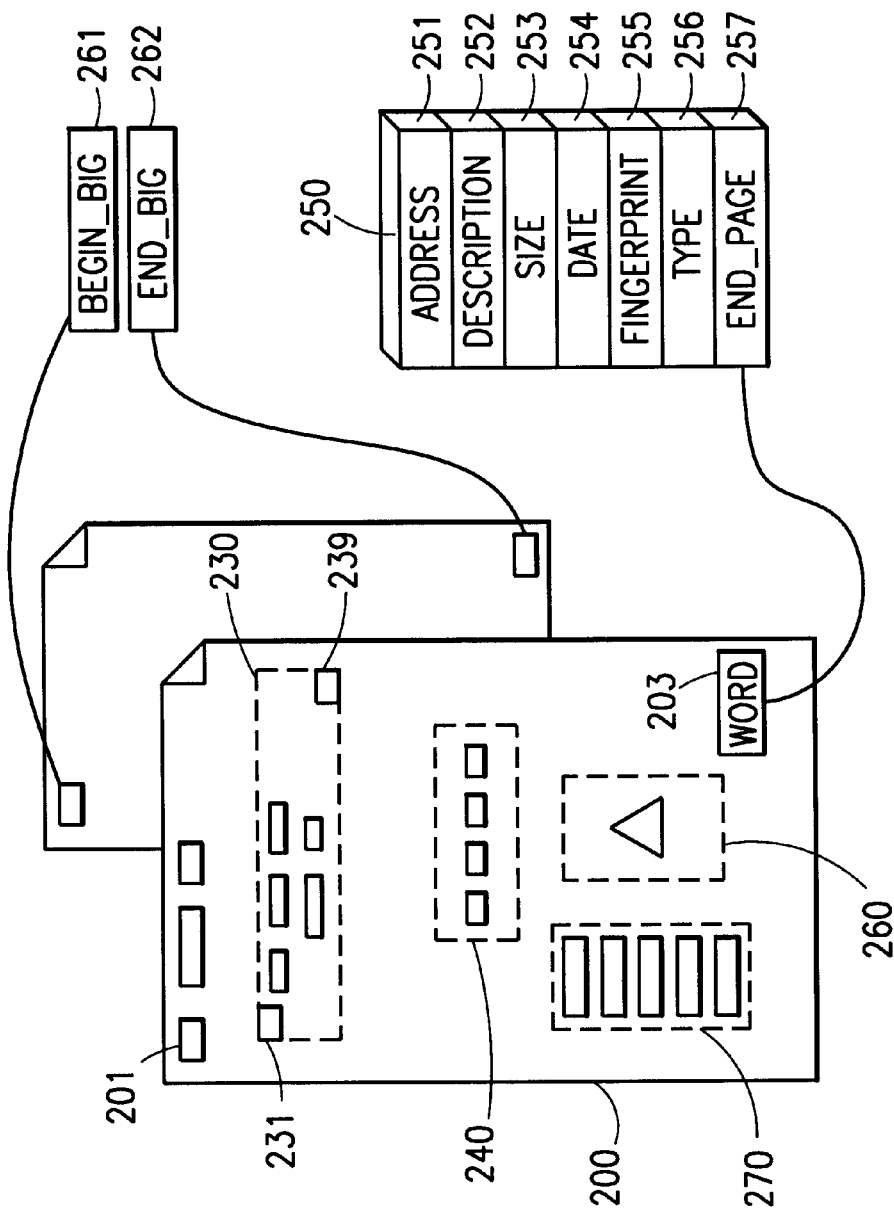
FIG. 4 is a block diagram of content attributes generated by the search engine.

As shown in FIG. 4, in addition to recognizing locations and words, the parsing module 30 also detects and encodes attributes about the content of the records or pages. Attributes can be associated with entire pages, portions of pages 230, 240, 270, and 260, e.g., fields, or individual words 203.

Attribute values, as defined herein, are expressed as "metawords." Metawords are also stored as literals, this means that the search engine 140 treats metawords the same as words. Therefore, a metaword is associated with a location to form a pair [metaword, location]. For a record attribute, which relates to an entire record, the location of the last word of the page is associated with the attribute. For field attributes which relate to portions of the record, the first and last word of the fields are associated with the attributes.

For example, the page 200 of FIG. 4 can have associated page attributes 250. Page attributes 250 can include □ADDRESS□ 251, □DESCRIPTION□ 252, □SIZE□ 253, □DATE□ 254, □FINGERPRINT□ 255, □TYPE□ 256, and □END_PAGE□ 257, for example. The symbol "□," represents one or more characters which cannot be confused with the characters normally found in words, for example "space," "underscore," and "space" (sp_sp).

The ADDRESS 251 encodes, for an exemplary Web page, the URL. The DESCRIPTION 252 may be the first two or three lines of the page. This information can help a user identify a page that would be of interest.

The SIZE 253 can be expressed as the number of bytes of a page. The size information can help a user determine the amount of bandwidth needed to "download" the page, and the amount of memory needed to store the page. The DATE 254 can be the date that the page was generated, or last modified. In the case of multiple versions of extant pages, the most recent page may be more significant to users. The SIZE and DATE attributes can be searched using range-based values.

For example, a search can request to locate information of pages with a certain size or date range. Therefore, these attributes are stored in a specialized (power-of-two) manner as multiple attributes, described in greater detail below.

The FINGERPRINT 255 represents the entire content of the page. The fingerprint 255 can be produced by applying one-way polynomial functions to the digitized content. Typically, the fingerprint is expressed as an integer value. Fingerprinting techniques ensure that duplicate pages having identical content have identical fingerprints. With very high probabilities, pages containing different content will have different fingerprints.

The TYPE attribute 256 may distinguish pages having different multimedia content or formatting characteristics.

Other types of page related attributes which have been determined to be useful are □BEGIN_BIG□ 261, and □END_BIG□ 262. Here, "BIG" means that the number of words of the page exceeds some predetermined threshold value, e.g. 16K. By making the □BEGIN_BIG□ and □END_BIG□ attribute values a searchable metaword, traversal of the index 70 can be accelerated if the number of words in most pages is less than the threshold value, as explained in greater detail below. The locations of these two attributes are respectively associated with the first and last words of big pages.

End Page

For each page, the parsing module also synthesizes an □END_PAGE□ attribute 257. The □END_PAGE□ attribute 257 is used extensively by the index stream readers 60 of FIG. 2 to converge on pages containing words or phrases specified in the queries 52. This is due to the fact that the ultimate selection criteria for qualifying content information is page specific. By inserting the □END_PAGE□ attribute value in the index 70 as a metaword, searching the index as described below can be more efficient.

The locations associated with attributes may be locations of the words expressing the content to which the attributes apply. For example, if the last word 203 of the page 200 of FIG. 4 has a location 306, as shown in FIG. 3, then in addition to producing the pair [306, word], the parsing module 30 also produces the attribute pair [306, □END_PAGE□]. This means locations associated with this metaword clearly define page boundaries. Alternatively, the attributes can have the first and last locations of the set of words (field) associated with the attributes.

Explicit Page Breaks

During parsing, it is possible to allocate one or more locations between the pages as the locations where attributes are stored. For example, one or more locations could be set aside between the last location of a previous page and the first location of a next page for indicating page related attribute values.

Title

Attribute values or metawords can be generated for portions of a page. For example, the words of the field 230 may be the "title" of the page 200. In this case the "title" has a first word 231 and a last word 239. In "html" pages, the titles can be expressly noted. In other types of text, the title may be deduced from the relative placement of the words on the page, for example, first line centered. For titles, the parsing module 30 can generate a □BEGIN_TITLE□ pair and an □END_TITLE□ pair to be respectively associated with the locations of the first and last words of the title.

Cite

The field 240 can be identified by the parsing module 30 as a citation field expressed, for example in italic, underlined, or quoted characters. In this case, the parsing module can generate □BEGIN_CITE□ and □END_CITE□ metawords to directly index the title.

Tables

The field 270 can have table attributes. In this case, the vertical and horizontal arrangement of the words may determine the collating order of their locations.

Graphics

The field 260 may be identified as a graphic symbol. In this case, the attribute values or metawords can encode, for example, □BEGIN_GRAPHIC, and □END_GRAPHIC□.

Other Attributes

Attributes can also be associated with individual words, for example, a word may have an □AUTHOR□ attribute, a □LINK□, or an □AUDIO□ attribute, and so forth. Other indexable attributes can include image tags, e.g., "comet.jpg," host (site) names, e.g., "digital.com," or Web newsgroup, "rec.humor," or user specified attributes.

The Productions of the Parsing Module

Figure 5:
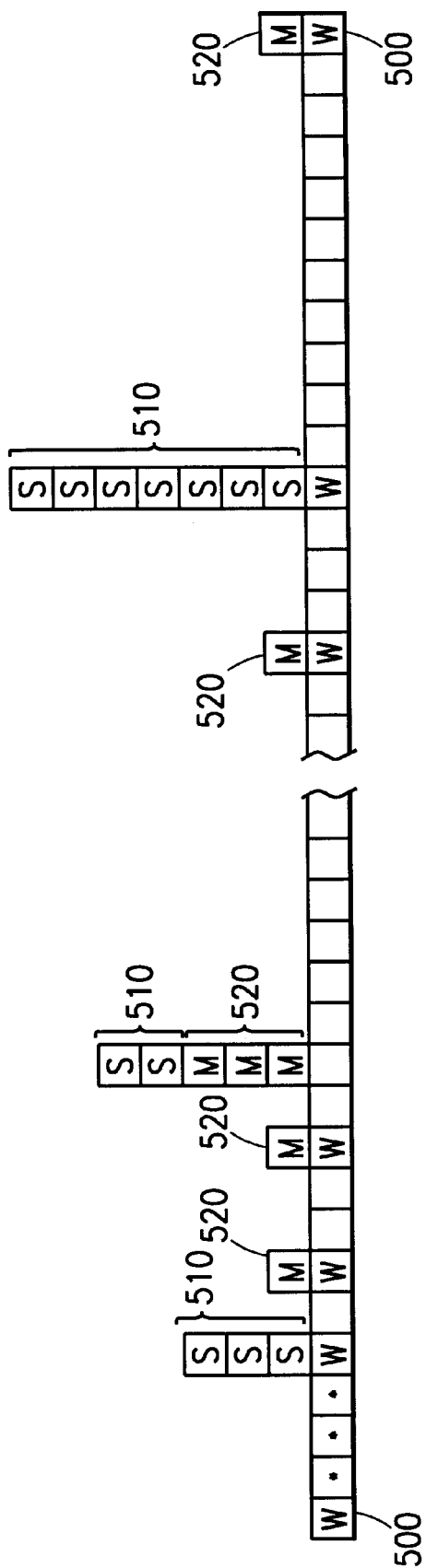
FIG. 5 is a sequential representation of the content and attributes of the pages of FIG. 3.

FIG. 5 abstractly shows a view of the words and metawords of the pages 200 as produced by the parsing module 30. The parsing module 30 produces a sequence of pairs 500 in a collating order according to the locations of the words 300 of the various pages 200. Some of the words may also cause the parsing module 30 to generate synonymous words (S) 510 for the same location. Metawords (M) 520 are generated to describe page, field, or word related attributes.

The Indexing Module

As stated above, the indexing module 40 generates an index 70 of the content of the records or pages 200. The internal data structures 71–73 of the index 70 are now described first with reference to FIG. 6.

It should be noted, that in the following description, the term "word" is used to include both words and metawords as defined above, unless expressly noted otherwise. Making words and metawords substantially indistinguishable as literals greatly improves the efficiencies of the data structures and processing steps of the search engine 140.

In order to prepare the pairs 400 to be indexed, the pairs are sorted first in word order, and second in location order.

Sequential Fully Populated Word and Location Entries

Figure 6:
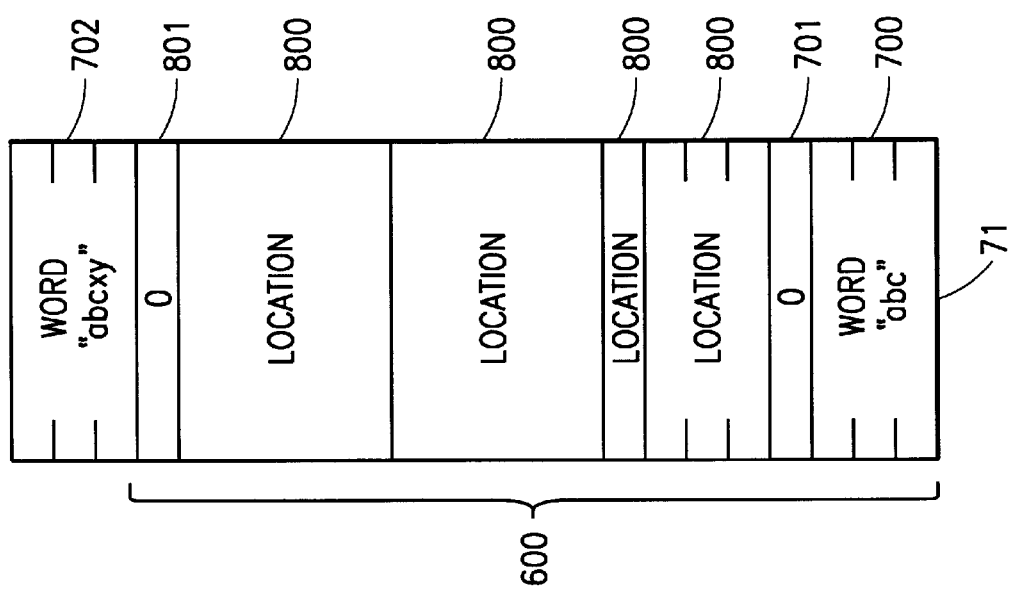
FIG. 6 is a block diagram of sequential words and their locations.

In the compressed data structure 71, as shown in FIG. 6, a word entry 700 of a first index entry 600, e.g., the literal "abc," is followed by the locations 800 where the word 700 occurs. The word 700 is stored as one or more 8-bit bytes. The bytes which comprise the word are followed by a terminating byte 701 having a zero value.

Each location entry 800 is expressed as one or more bytes. The last location entry for a particular word includes a zero byte 801 as a terminator. In the data structure 71, the last location of a word is immediately followed by the next index entry including the word entry 702, e.g., the literal "abcxy," and its locations.

In an index of the Web, the word "the" might appear at hundreds of millions of different locations. Therefore, in the index 70, the entry for the word "the" is followed by millions of location entries. Altogether, the search engine 140 may include hundreds of millions of different word entries. In addition, as the number of pages of the Web increase, so does the size of the index 70.

Therefore, the search engine 140 uses a number of different compressing techniques to decrease the amount of storage required for the index. In addition, summarizing techniques are used to reduce the processing requirements while searching the compressed data of the index.

Compressing Word Entries

Figure 7:
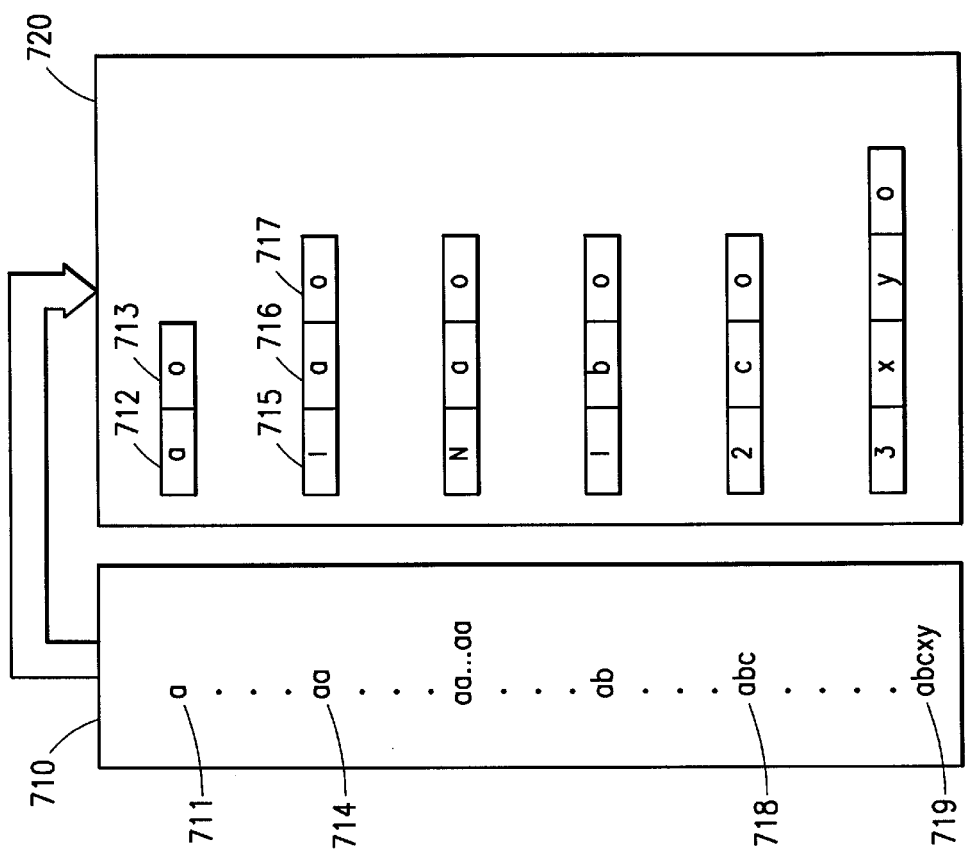
FIG. 7 is a block diagram of a compression of words.

FIG. 7 shows a prefix compressing technique which can be used to map from words 710 to compressed words 720. Recall that the index maintains the words in a collating order of their values. If the first possible indexed word 711 has a value "a," then the compressing yields one or more bytes 712 representing the value of the character "a", followed by a zero byte 713.

The next indexed word 714, e.g., "aa" may have some prefix characters in common with the preceding word. In this case, the compressing indicates the number of common prefix characters 715, e.g., "1" followed by the different postfix characters 716, followed by the terminating zero byte 717, and so forth. For example, the word "abcxy" 719 has three prefix characters in common with the previously encoded word "abc" 718 and the different characters are "xy." If a word has no prefix characters in common with a preceding word, then the word is encoded as for the first word.

Compressing Location Entries

Figure 8:
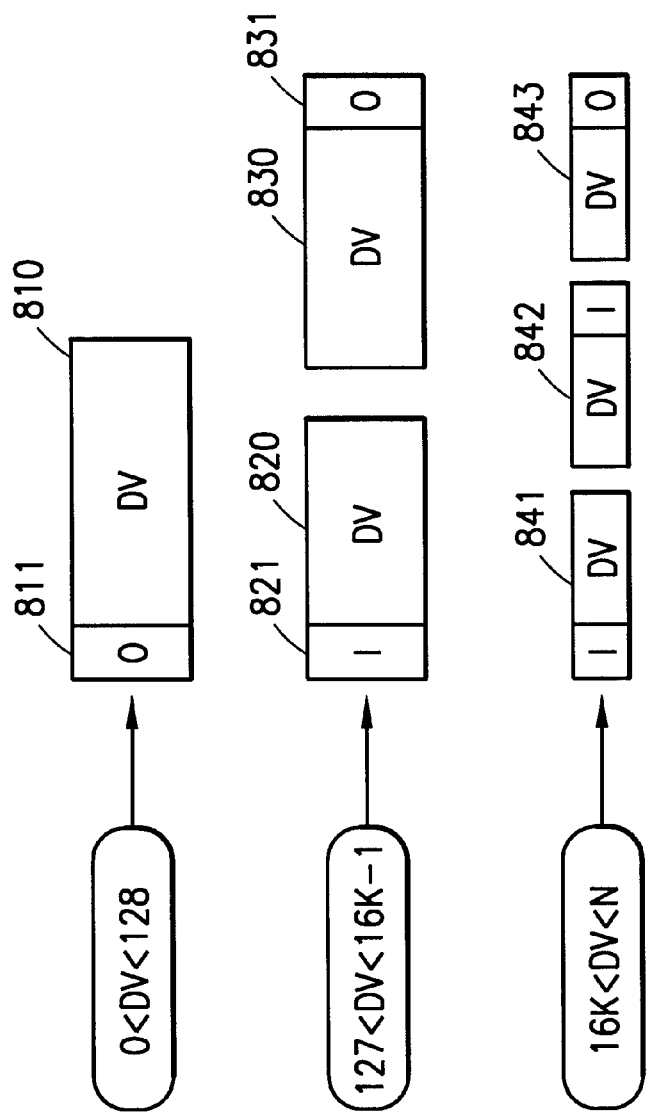
FIG. 8 is a block diagram of a compression of locations.

FIG. 8 shows a delta value compressing technique which can be applied to the locations 800 of FIG. 6. The technique takes advantage of the fact that frequently occurring words such as "the," "of", "in," etc., are located close to each other. Therefore, compressing the locations minimizes the number of bytes consumed to express the numerous locations of common words which appear close to each other.

Each location of a word is expressed by a delta value (DV). The delta value means that the location is expressed as a relative offset in locations from a previous location. The first location for a particular word can be the offset from location "0." For example, if a first occurrence of the word "the" is at location "100", and next occurrences are at locations "130" and "135," the delta values are respectively expressed as 100, 30, and 5.

If the delta value is in the range of $0<DV<128$, the DV is encoded as a single byte 810 with the low order (left-most) bit 811 set to zero, see FIG. 8. The remaining seven bits express the DV. If the DV is in the range $127<DV<16K-1$, the DV encoding consists of a first byte 820 with the low order bit 821 set to a logical one to indicate that a continuation byte 830 follows. The continuation byte 830 has the high order bit 831 set to a logical zero signalling the end of the delta value encoding.

For delta values 16K or greater, the first byte 841 has the low order bit set to a one, the other bytes 842 have the high order bit set to a one, and the last byte 843 has the high order bit set to zero to indicate the end of the delta encoding for a particular location.

The compressing technique is optimized for delta values in the range of 1 to 16K–1, since the majority of delta values are expected to fall within this range. Thus, delta values in this range can be uncompressed by shifting the content of two bytes by one. Because the high order bit of the second byte is zero, no further processing, like bit clearing, is required to extract the delta value.

Scanning the Word and Location Entries

Delta value compressing as described herein allows the index stream readers 60 of FIG. 2 to "scan" the index at a great rate while uncompressing and trying to reach a target location. The most frequently occurring delta values, e.g., one and two byte delta values, only require six machine executable instructions to recover and evaluate a next location. With dual-issue processors, the index stream readers 60, which do the bulk of the work in the search engine 140, can process a next locations in three machine cycles. This may mean, for a 300+ MHz processor, that the stream readers could process a stream of delta values at a rate of approximately 100,000,000 locations per second.

It should be understood, that other types of loss-less compressing techniques can be used to reduce the amount of storage for the word and location entries in the compressed data structure 71 of FIG. 2. In addition to compressing with software procedures, the compressing could also be performed by hardware means, using for example, Huffman or Lempel-Ziv codings.

The Logical and Physical Data Structure of the Index

Figure 9:
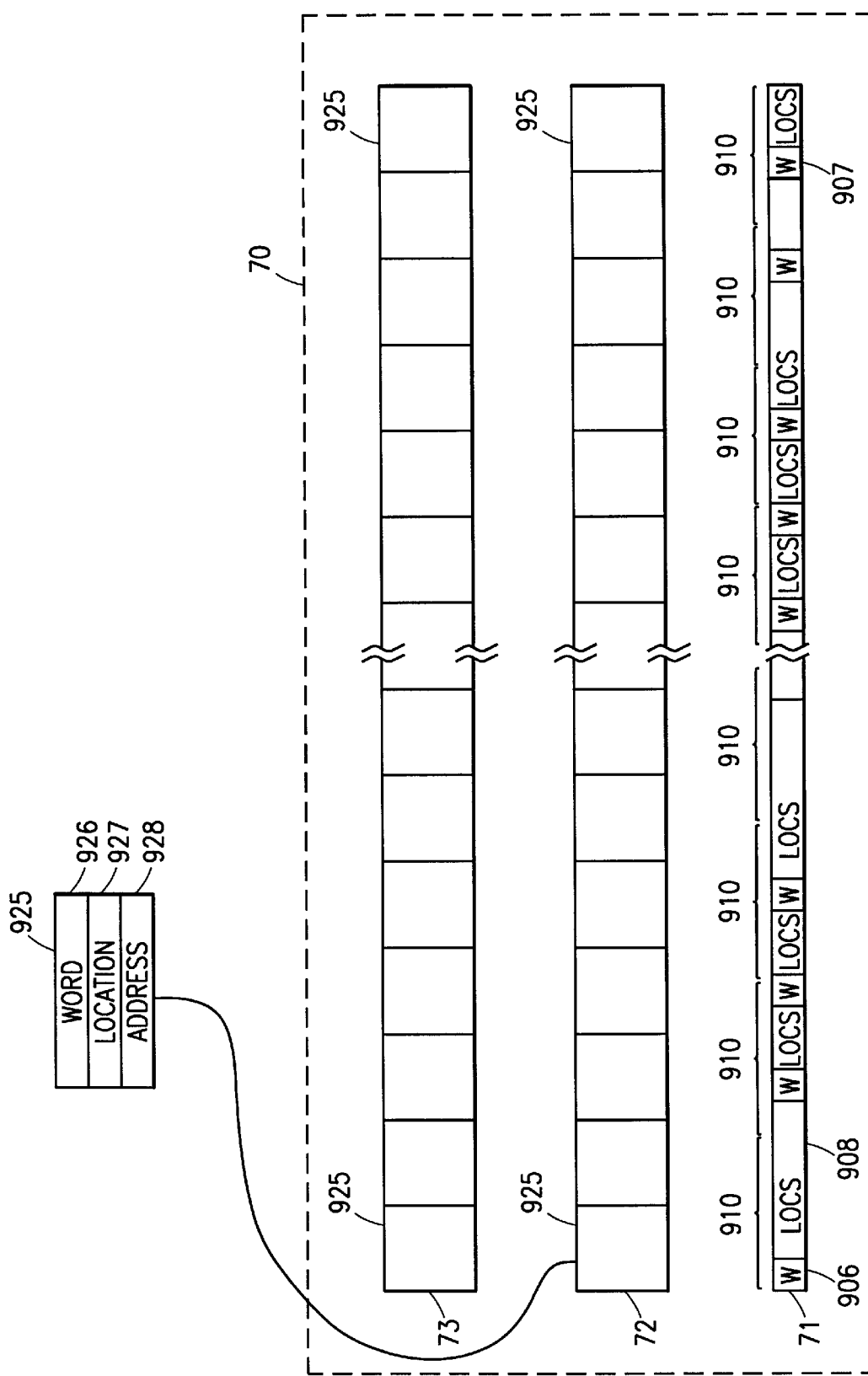
FIG. 9 is a logical to physical mapping of the index.

FIG. 9 shows the data structures 71–73 of the index 70 of FIG. 2 in greater detail. The data structure 71 maps the compressed entries (words and locations) onto a physical media of the search engine 140, e.g., the memories 144 and disk 146 of FIG. 1. Logically, the compressed data structure 71 sequentially stores the words (and metawords) having unique (binary encoded) values in a collating order according to their values. There is a lowest valued word 906 and a highest valued word 907. Each word is immediately followed by the set of locations (locs) 908 where the word appears in the numerous pages. The locations are stored in an increasing positional order.

Physically, the word and location entries of the compressed data structure 71 are stored in fixed size blocks 910 of disk files. The blocks 910 can be 2 KB, 4 KB, 8 KB, 16 KB, or any other size convenient for physical I/O and memory mapping. The physical media includes the disk 146 for persistent storage, and the memories 144 for volatile storage while the search engine 140 is operational.

Word and location entries are allowed to straddle block boundaries to fully populate the compressed data structure 71. Creating the blocks 910 for an exhaustive search of the Web may take several days of continuous processing of batches of pages 200.

Summaries of the Compressed Data Structure

As the first level compressed data structure 71 is being generated, a second level summary data structure 72 can also generated. The summary data structure 72 is generated using a sampling technique. The technique periodically "samples" the location entries 800 being placed in the compressed data structure 71. For example, a sample is taken whenever about a hundred bytes have been written to the compressed data structure 71. Since the average size of the location entries is approximately two bytes, a sample is taken about fifty entries.

It should be understood that the compressed data structure 71 can be sampled at higher or lower byte rates. Sampling at a higher rate improves the granularity of the summary, but increases its size, and sampling at a lower rates decreases granularity and storage.

The samples are used to generate summary entries 925 in the second level summary data structure 72. Each summary entry 925 includes the word 926 associated with the sample, and the sampled location associated with the word. In addition, the summary entry 925 includes a pointer 928 of the next entry in the compressed data structure 71 following the sampled entry. The summary data structure 72 can also be mapped into fixed size blocks or disk files to fully populate the summary data structure 72.

If the summary entries 925 store uncompressed words and locations, the summary data structure 72 can be searched in a non-sequential manner. For example, a binary search technique can be used on the summary data structure 72 to rapidly locate a starting point for a more fine grained sequential search of the compressed data structure 71. If some of the summary entries 925 are compressed, storage space can be reduced, while allowing a modified binary searches.

For example, during operation of the search engine 140, as explained in greater detail below, the summary data structure 72 can first be searched to find a summary entry 925 having a location 927 closest to, but not greater than a target location. The pointer 928 of that summary entry can then be used as a starting address to begin scanning the compressed data structure 71. The location 927 of the summary entry can be the base for adding the delta value of the next entry of the compressed data structure 71 referenced by the address of the summary entry.

In the event that the size of the summary data structure 72 becomes too large to store entirely in the dynamic memories 144, the third level summary data structure 73 can dynamically be generated. For example, the summary data structure 72 can be scanned while periodically taking samples to generate the summary entries of the data structure 73. The summary data structure 72 can be sampled at a rate which is the same or different than the sampling rate used to build the summary data structure 72. The summary entries 925 of the third level summary data structure 73 are similar in construction to the entries of the second level. The top level summary data structure can be sized to fit entirely in the memories 144.

As an advantage of these structures 71-73, a very large index can be searched using a minimal number of time-consuming disk I/O operations. If all of the top level summary data structure 73 is stored in dynamic memories 144, and the sampling rates are relatively high, e.g., one sample every hundred bytes, then at most two disk access are required to begin the sequential reading of location delta values of the compresses structure 71.

The Maintenance Module

The index 70 is optimized for searching, hence the parsimonious compressing and summary entries. Keeping such a large index current presents special problems because this type of structure may be less suitable for conventional maintenance operation. For example, it may periodically be necessary to admit modified or new entries, and to expunge deleted entries.

Deleting a single page may require the reordering of millions of location values of the data structures of the index 70 of FIG. 9 because of "holes" left by deleted words and location entries. For any page which is deleted, all of the locations of the following pages need to be adjusted, byte by byte. For example, if a deleted page includes 888 words, the locations of the following pages need to be reduced by 888.

Adding a page presents additional complexities. For words which already have entries in the index, now locations need to be added. New unique words and their locations in the added pages need to be inserted in the index structure in their correct collating order.

A Two-Dimensional Array of Files to Store the Index

Figure 10:
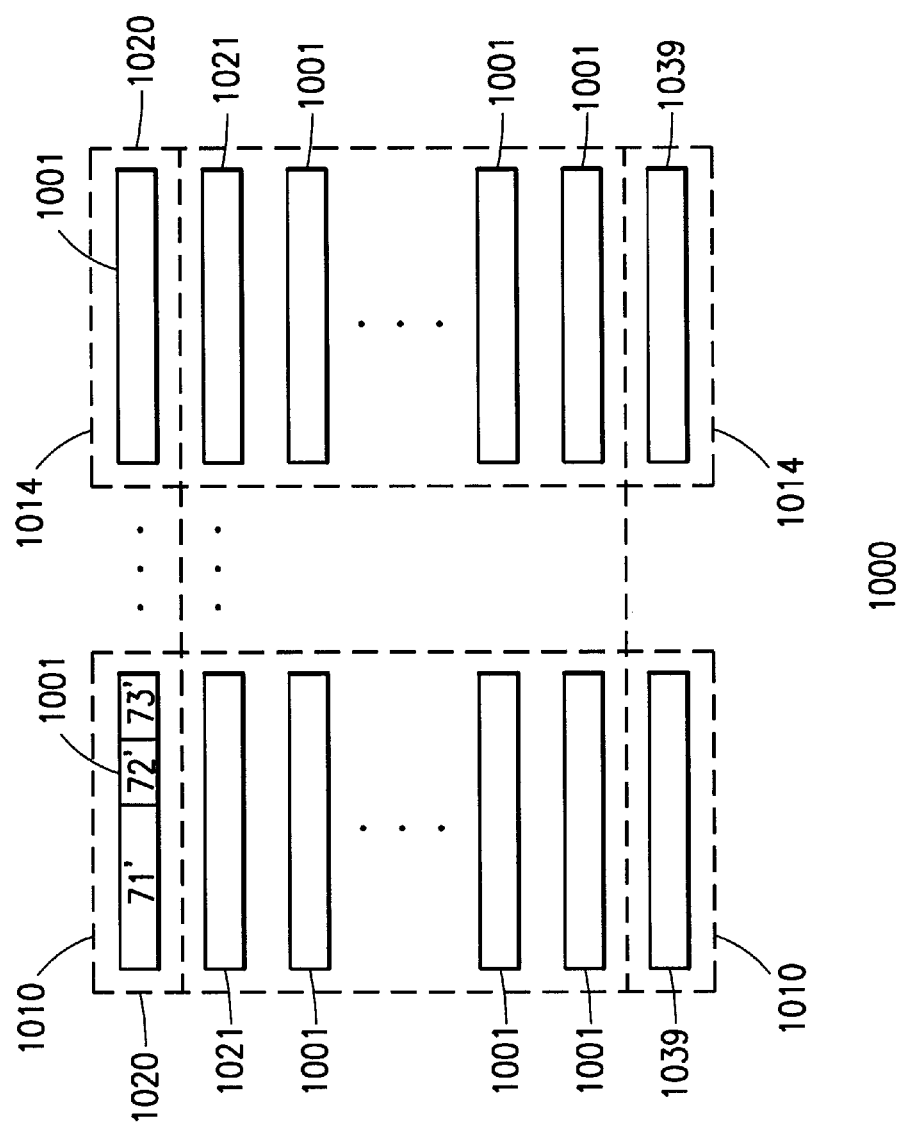
FIG. 10 is a block diagram of an array of files used to arrange the index.

As shown in FIG. 10, the index 70 is organized as a two-dimensional array 1000 of data structures 1001 to allow concurrent searching and maintaining of the index 70. By having multiple data structures 1001, the index 70 can be updated incrementally on a per data structure basis. The array 1000 includes a plurality of tiers 1010–1014 and a plurality of buckets 1020–1039, e.g., respectively columns and rows. The dimensionality of the array 1000 is described below.

Each data structure 1001 includes for example, two disk files. One file 71' to store a portion of the compressed data structure, and a second file 72' for storing the corresponding summary data structures 72. The third data structure 73 is stored in the memories 144.

By partitioning the index 70 over the multiple data structures 1001, the updating problems stated above are minimized since the size of the files concurrently being modified is greatly reduced. Multiple files allow small changes to be made to the index 70 without incurring too much additional maintenance overhead.

Buckets

The words (and their associated locations) are allocated to the buckets 1020–1029 according to a hash encoding of the (binary encoded value) of the words. For example, the hashing can disperse the words (and their locations) over twenty buckets 1020–1039. The sequential ordering of the words within a particular bucket is maintained. The hashing merely serves to evenly distribute the words (and their locations) over the buckets.

By keeping the number of buckets relatively small, e.g., approximately twenty, frequently occurring words do not unnecessarily overload any one bucket. For example, the bulk of the Web pages are expressed in the English language. In English text, the word "the" normally appears about every fiftieth word. If the number of buckets was made to be larger than about fifty, one of the buckets would likely contain a disproportionate number of location entries, e.g., the locations of the word "the."

Tiers

The tiers 1010–1014 are produced as follows. Recall that the parsing of the pages 200 can proceed in batches. Each batch is encoded as one of the tiers. During parsing and indexing, a first batch of pages would produce the first tier 1010, a next batch the next tier, etc., a fifth batch would produce the tier 1014. The number of tiers extant at any one time is dependent on how frequently merging takes place, see below.

As additional tiers are generated, the subsequent tiers of a particular bucket essentially become extensions of previous tiers of the same bucket. That is, the locations of words in later generated tiers of a particular bucket follow the locations of words in earlier generated tiers of the same bucket.

Merging Tiers

The search engine 140 is designed to reduce the number of tiers. This produces optimum performance, since switching from one tier to another while searching the index requires higher level and more time consuming system services.

Therefore, the maintenance module 80 periodically merges a following tier with a previously generated tier. While merging tiers, the collating order of the word and location entries is preserved. In order to maximize the efficiency during a merge/sort, subsequent tiers are merged into a previous tier only if the amount of data in a subsequent (later) tier are at least as much as the data stored in the previous tier of the same bucket.

If the number of bytes in the index is N, then the time to update is N log N bound, as opposed to $N^2$ bound should a single data structure be used. This makes the updating of an extremely large index that is optimized for searching tractable.

Deleting Entries

During merge/sort, deleted entries of the index are expunged. The deleting of entries proceeds as follows. Remember, all words and metawords and their locations are sequentially indexed. Therefore, deleting a page can affect a large portion of the index 70.

Deleted pages can be detected by the automated browser 20 of FIG. 1. For example, the browser 20 periodically searches the Web to determine if a previously indexed page is still active. If the page is gone, the browser 20 can inform the maintenance module 80. Deleted pages can be noted in the index by attaching a "deleted" attribute to the page. The deleted attribute can have a special attribute value, for example, □DELETED□. The location associated with the deleted attribute can be the same as the location of the last word of the page to be deleted.

Once a page has a deleted status, words associated with the page are ignored during searching. Deleted pages can be identified by modifying the queries, described below, to check if a page has an associated □DELETED□ attribute.

During merge/sort, index entries of a subsequent one tier are merged with those of a previous trier of the same bucket. The union of the merged index entries are placed in a new tier having "new" locations. Deleted word or location entries are expunged.

Note, the manner in which the tiers were generated guaranties that the locations stored in a subsequent tier are an extension of the locations stored in the previous tier. In order to make the index available during merging, a location remapping table is used to map locations of the new space into equivalent locations expressed in the old space.

Remapping Table

Figure 11:
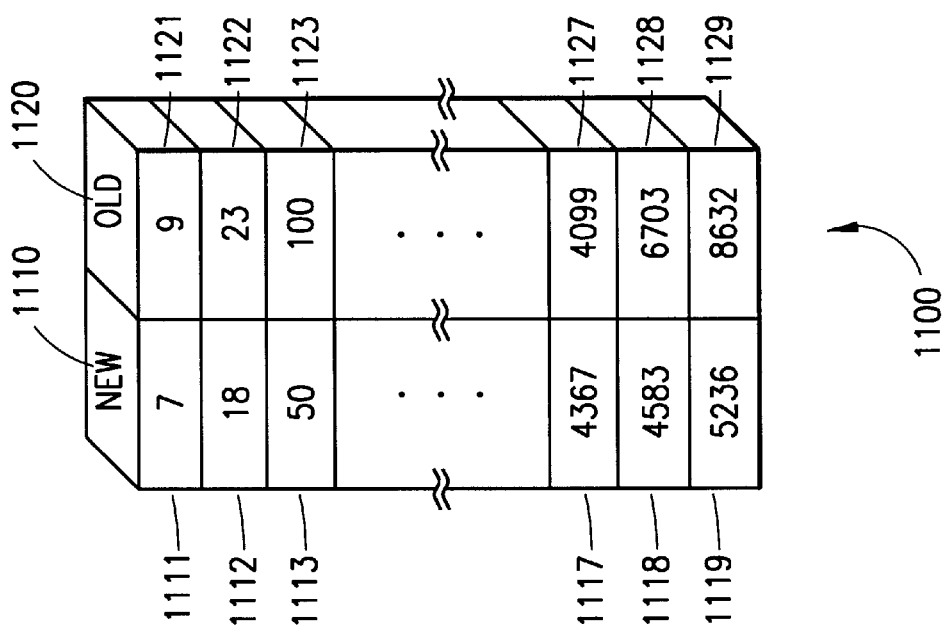
FIG. 11 is a block diagram of a remapping table used while deleting entries.

As shown in FIG. 11, the remapping table 1100 for the entire index 70 includes a first column 1110 of locations 1111–1119 which reflect the "new" or merged portion of the index, and a second column 1120 of "old" locations 1121–1129. For the example mapping shown, the first entries 1111 and 1121 indicate that location "9" in the old space, is equivalent to location "7" in the new merged space, e.g., locations "7" and "8" in the old space are deleted.

During a merge/sort of the tiers of the various buckets, some of the data structures 1001 will be processed before others. This means that some files of the data structures 1001 will have their locations expressed in "new" space, and other files will still be expressed in "old" space. Therefore, associated with each data structure 1001 is an "old/new" indication.

The query module 50 treats all words as being defined in terms of locations of the old space, until all of the buckets have been converted to the new space. Therefore, while the index stream readers 60 of FIG. 2 are scanning the index 70, locations of words found in the "new" space are mapped back to "old" space locations using the mapping table 1100, until the merge/sort operation has completed.

In order to allow the deletion of pages to proceed in a deterministic fashion, the □DELETED□, □END__

PAGE☐, ☐BEGIN_BIG☐ and ☐END_BIG☐ attributes are hashed into a bucket whose tiers are merged last, for example, bucket 1039 of FIG. 10. Thus, these page related attribute will not be deleted until all words of the deleted pages have been processed.

The Query Module

The operation of the search engine 140 with respect to the query module 50 and the index stream reader objects 60 is now described in greater detail. Although the FIG. 2, shows the query module 50 interacting with users via the network 130, it should be understood that the search engine 140 can also be configured to process locally generated queries. This would be the case where the database indexed, the client programs, the search engine 140, and the index 70 all reside on a single computer system, e.g., a PC or workstation.

Query Expressions

Each of the queries 52 can be in the form of an expression of a query language. Terms of the expression can be a single word or metaword, multiple words, or phrases, or even parts of words. For example, the query expression can be "fruit," meaning find all pages which include at least the word "fruit." A multiple word query could be paraphrased as:

find all pages including the words "fruit" and "vegetable," meaning find pages including both the word "fruit" and the word "vegetable."

Phrase

Phrases are multiple words or characters enclosed by quotation marks, for example, "the cow jumped over the moon." In this case, a qualifying page must contain the words or characters exactly is indicated in the quoted phrase.

Partial Words

A partial stem-word can be specified with the "*" character, for example as "fruit*" to locate pages containing the words fruit, fruity, fruitful, or fruitfly, and so forth.

Query Operators

Logical

In the case where the query expression includes multiple terms, the terms can be related by operators. The operators can be the Boolean operators AND, OR, NOT.

Positional

Positional operators can include NEAR, BEFORE, and AFTER. The NEAR operator means that the a word must be within, for example, ten locations of another word. A query "a before b" specifies that the word "a" must appear before the word "b" in the same page, and the query "a after b" means that the word "a" must appear after the word "b."

Precedence

Expressions can be formed with parenthesis to indicate processing precedence ordering. For example, the query expression "(vegetables and fruit) and (not (cheese or apples))" locates all pages that include at least the words "vegetable" and "fruit," but not the words "cheese" or "apple."

Case

In general, the parsing of the individual words of queries is similar to the parsing done by the parsing module 30. This includes the treatment of capitalization, punctuation, and accents. Thus, a search for the word "wombat" will also locate pages with the word "WoMbat," or "wOmbAT." That is, words expressed in lower case characters will match on any other form of the character such as upper case, accent, etc, since the query parser will produce the appropriate synonyms.

Punctuation

Since the search engine 140 generally ignores word separators, a term of the expression can be specified as an exact phrase by enclosing the characters of the phrase within quotes. For example, a query including the phrase "is the wombat lost?" must exactly match on the quoted characters.

Range-based Values

Query expressions can also include range-based terms, such as dates or sizes. For example, "Jan. 1, 1995–Jan. 31, 1995" means any date in the year 1995. The handling of range-based values in the index 70 is explained in greater detail below.

Parsing Queries

Figure 12:
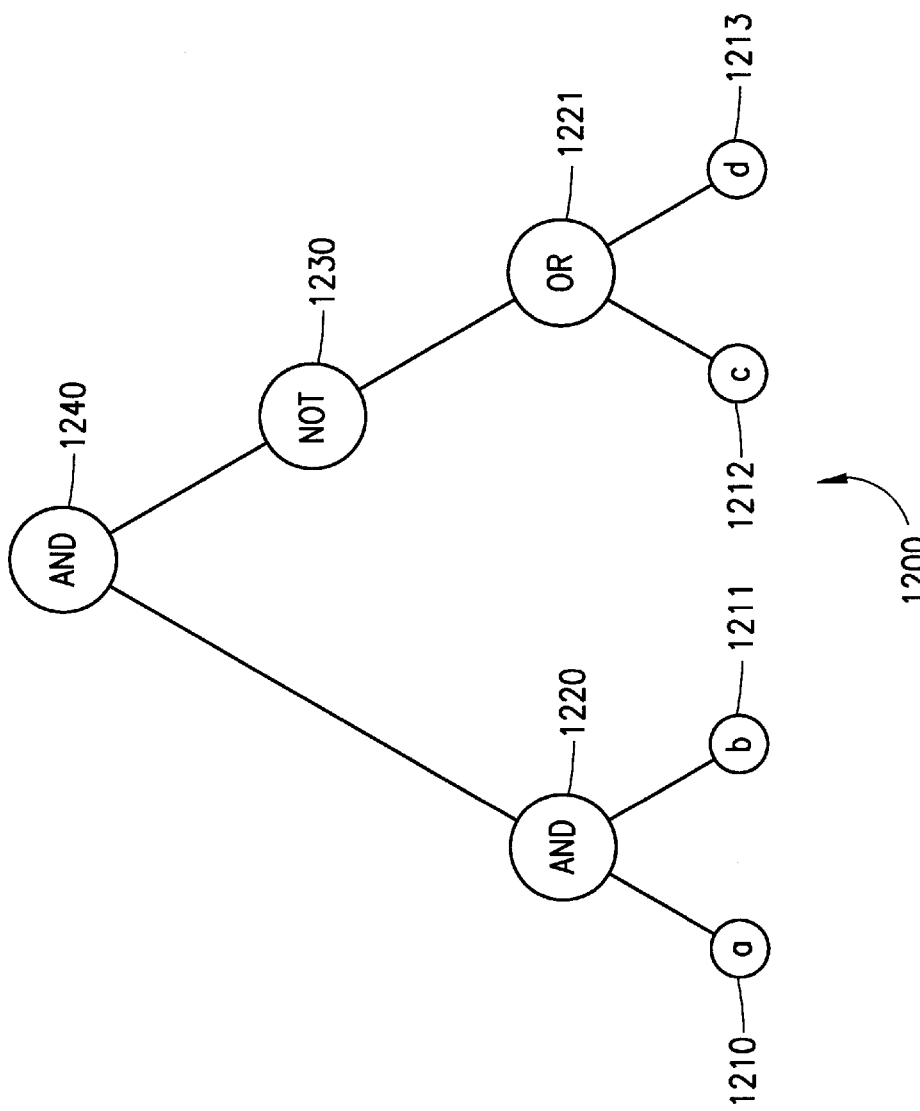
FIG. 12 is a tree representation of a query processed by the search engine.

As shown in FIG. 12, the query module 50 can represent the query expression "(vegetables and fruit) and (not (cheese or apples))" as a query tree 1200. The bottom level leaf nodes 1210–1213 respectively represent the basic words "vegetables, fruit, cheese, and apple" (a,b,c,d). The AND node 1220 is applied on the words vegetable and fruit, and the OR node 1221 is applied to the words cheese and apple. The NOT node 1230 is applied on the node 1221, and the AND node 1240 joins the two main branches of the tree 1200.

Index Stream Reader Objects

In order to locate pages which are qualified by a query, the query module 50 communicates with the index 70 via object oriented interfaces, for example, the index stream reader objects (ISRs) 60. Each ISR object 60 is an encapsulation of a data structure and methods which operate on the data structure. The encapsulated data structure reference portions of the index 70, for example the files 71', 72', 73' of the data structures 1001 of FIG. 10. Since the query module 50 interfaces with each object via a single object "handle," the query module 50 does not need to know the internal workings of the ISRs 60. Furthermore, the objects can be polymorphic. This means similar objects can be viewed via a common interface.

As an advantage of the index 70, the search engine 140 can employ a very small number of basic types of stream reader objects 60. With these ISR objects 60, the query module 50 can resolve any query expression.

Object References

Figure 13:
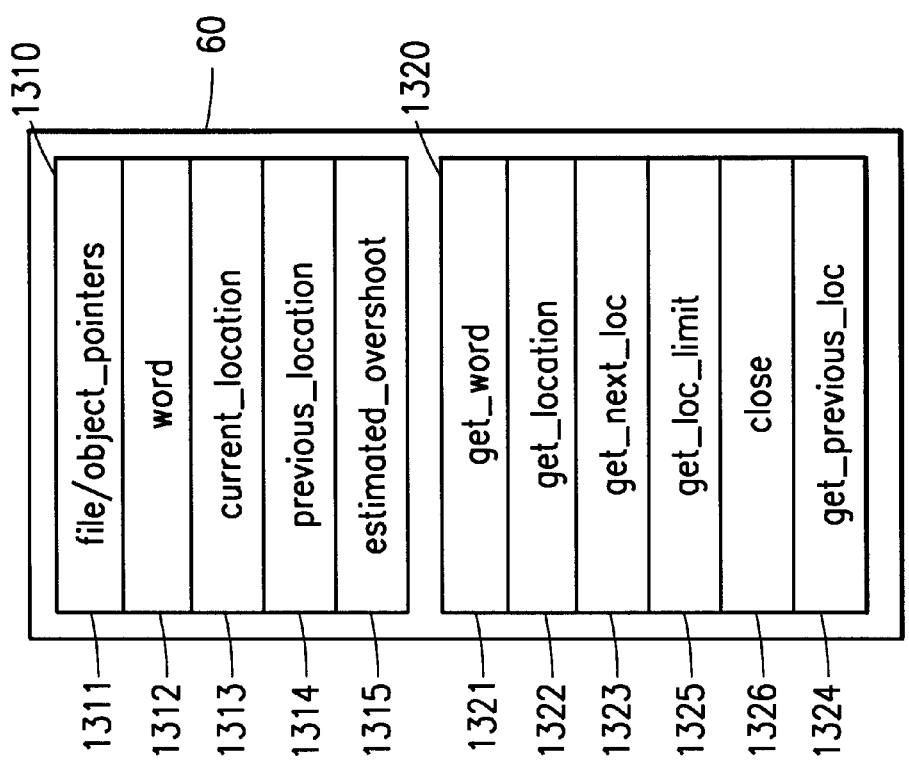
FIG. 13 is a block diagram of an index stream reader object.

As shown in a general form in FIG. 13, an ISR object 60 includes data references 1310 and method references 1320. Some of the objects do not need to use all of the references. The data references 1310 can include a file/object_pointer 1311, a word 1312, a current_location 1313, a previous_location 1314, and an estimated_overshoot 1315. The methods 1320 referenced can be get_word 1321, get_location 1322, get_next_loc 1323, get_loc_limit 1325, close, and for some objects, get_previous_loc 1324.

Data References

The file/object_pointer 1311, for a simple or basic object references, the files 71', 72', and 73' of the data structures 1001. For a complex or compound object, the pointer 1311 references other objects. The word 1312 indicates which unique word or metaword is currently being searched by the ISR object. The current_location 1313 references a current location of the word during index stream processing. The previous_location 1314 can reference, for some objects, a previously processed location.

The estimated_overshoot 1315 is described in greater detail below with respect to a compound index stream reader which determines a conjunctions of other index stream readers (isr_AND). The estimated_overshoot is used to optimize the scanning of the index by the isr_AND stream reader object.

Method References

In general, the methods of an object, if successful, produce a TRUE condition, and possibly a value. If a particular method is not performed successfully, a logical FALSE condition is returned.

Get_word

The get_word method 1321 yields the value of the word 1312. The method 1321 can be referenced by the query module 50 as "get_word isr," where "isr" is the "handle" of the index stream reader object.

Get_loc

The get_loc method 1322 yields the current_location 1313 associated with the word of a particular index stream reader, e.g. "get_loc isr." The two methods 1321 and 1322 have no side effects on the ISRs, e.g., they return values while leaving pointers unchanged.

Get_next_location

The get_next_loc method 1323 advances the current_location 1313 to the next immediate location where the word occurs, if there is one, otherwise the method 1323 yields a logical FALSE condition.

Get_loc_limit

The get_loc_limit method 1325 can have a reference in the form of "get_loc_limit isr, target_location, limit." That is, the get_loc_limit method 1325 takes three arguments, isr, a target location, and limit location. This method advances the current_location pointer 1313 to a next location which is at least as great as a target location, or alternatively, if that would cause the current_location 1313 to exceed the limit, the method may do nothing, and return a FALSE condition.

Close

The method close 1326 deletes the object.

Get_previous_loc

The get_previous_loc method 1324 produces the previous location of a word with respect to the current location, if there is one, otherwise a logical FALSE condition is returned. This method does not change the current-location 1313. It should be noted, as explained below, that in the case of an isr_and and an isr_not object, it is not possible to determine the previous location.

This method is useful to determine the range of locations which are part of a specific page. For example, if the index stream reader object is reading locations for the END_PAGE metaword, the current and previous locations define the range of locations of a page.

The Basic Index Stream Reader

A simple or basic isr object operates only on the location entries for one specific word. This means that advancing the current_location pointer 1313 is a relatively inexpensive operation. It should be noted that the current_location 1313 can only be advanced, and not reversed because of the delta value compression. This means, that the get_previous method 124 can only retrieve the location immediately previous to the current location.

Some query operations may be very time consuming to perform. For example, take the query:

find all pages containing "wombat," and not "a the." The word "wombat" will occur relatively infrequent. However, finding pages which do not contain the phrase "a the" can take many processing steps. Even though the phrase "a the" occurs infrequently, the words "a" and "the" independently will have a high frequency of occurrence. In this case, if the get_loc_limit method 1325 determines that advancing the current_location will be expensive, it may do nothing. Therefore, the get_loc_limit implementation, may decide not to advance the current_location 1313, and return a FALSE condition.

As will be demonstrated, the get_loc_limit method 1325 has some important properties when applied to the index 70. Recall, the get_loc_limit method advances the current location to a next location which is at least as great as a target location, unless that would cause the current_location to exceed the limit. This means that the get_loc_limit method can jump over intermediate locations to reach the target location where to resume the scan.

This jumping over locations can be accomplished by having the get_loc_limit method first scan the summary data structure 73, and then the summary data structure 72 to rapidly close in on the target location. By scanning the summary data structures 73 and 72 first, the uncompressing of many delta values of the compressed data structure 71 can be skipped.

Since the index 70 has a small number of interfaces, the interfaces can be highly optimized for searching, since optimization opportunities are well localized. In addition, the same interfaces that are used for searching the index can also be used by the merge/sort operation.

Opening Basic ISR Objects

During operation of the search engine 140, ISR objects 60 can be generated by the query module 50 with an OPEN procedure. In a basic form, the call to the OPEN procedure can be "OPEN isr x." Where "isr" indicates that an index stream reader object is requested for a valued word (or metaword) x, the OPEN procedure returns the "handle" of the object and the methods which are included with the object.

During operation, the isr x can return the locations of the word x using the method get_next_loc 1323 or the get_loc_limit method 1325. The locations can be recovered by adding a next delta value to the value of the previously determined location. It should be understood that in the case where the index includes multiple tiers 1014, the index stream readers sequentially progress through the tiers of the bucket into which the word x was hashed.

Opening Compound ISR Objects

The OPEN procedure can also generate index stream reader objects which relate a combination of previously opened readers. For example, the OPEN call can be of the form "OPEN isr_type (isr, . . . , isr), where isr_type can be "OR," "AND," or "NOT." and "isr, . . . , isr" are the handles of previously generated ISR objects.

For example, to perform the search for the union of the words "cheese" or "apple," the query module 50 can do the calls "OPEN isr cheese" and "OPEN isr apple," followed by OPEN isr_or (isr_cheese, isr_apple), where "isr_cheese," and "isr_apple" are the handles of the objects generated by the "OPEN isr x" calls. In this case, the methods of the isr_OR perform a merge and sort of the locations produced by the isr_cheese and isr_apple index stream objects. In other words, the isr_OR produces its output from the input of two other ISRs.

To perform the search for the conjunction of the words "vegetable" and "fruit," the calls can be "OPEN isr vegetable," "OPEN isr fruit," followed by "OPEN isr_AND (isr_vegetable, isr_fruit)". In general, ISR objects can reference any number of other ISR objects to generate an object oriented representation of, for example, the tree 1200 of FIG. 12 which logically represents an input query 52.

Opening ISRs for Metawords

While processing a query, additional index streams can be opened for words other than those explicitly specified in the terms of a query. For example, index stream readers for the metaword attributes ▫END_PAGE▫, and ▫DELETED▫ are typically opened so that page specific determinations can be made, e.g., skip over the locations of deleted pages.

Finding Qualifying Pages

Figure 14:
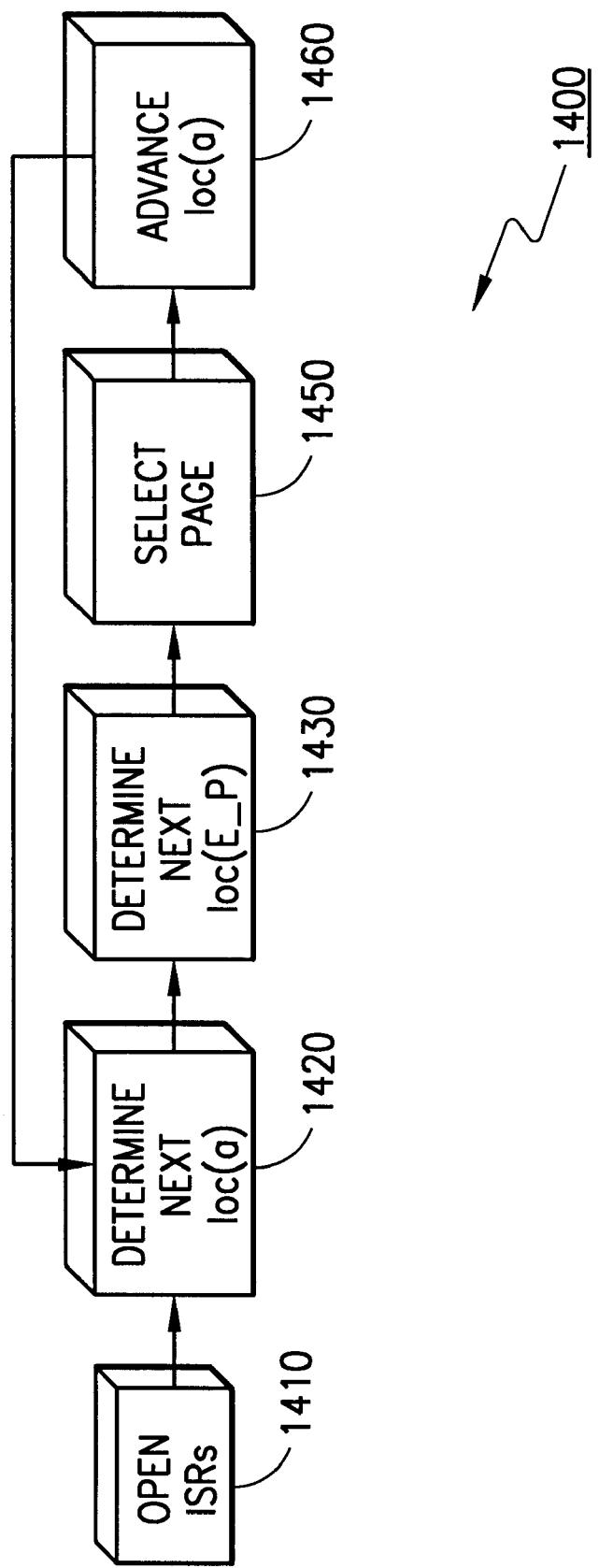
FIG. 14 is a flow diagram of a query search using the logical OR operator.

FIG. 14 shows a process 1400 for locating pages which contain at least one occurrence of a particular word, e.g. a query states:

find all pages containing the word "vegetable."

It should be understood that the process 1400 can be adapted to locate pages containing at least one of a set of words. In general, the process 1400 performs the search for the union of the words, e.g., "cheese," or "apple".

In step 1410, the OPEN procedure is called to open ISRs for the word "vegetable"(a), and the metaword END_PAGE (E_P), e.g., OPEN isr a, isr E_P. In step 1420, search the index 70 to determine a next location for the word a, e.g., determine loc(a) using the get_next_loc method of the isr_a object. Once the next occurrence of the word a has been located, determine the location (loc(E_P)) of an END_PAGE metaword which is at least loc(a) using the get-loc-limit, step 1430. In step 1450, select the page identified by loc(E_P) as a qualified page. Advance the location for the a stream to be at least one greater than loc(E_P), and repeat step 1420 until the end of the a stream is reached and all pages including at least one occurrence of the word a have been selected.

AND Index Stream Reader

Figure 15:
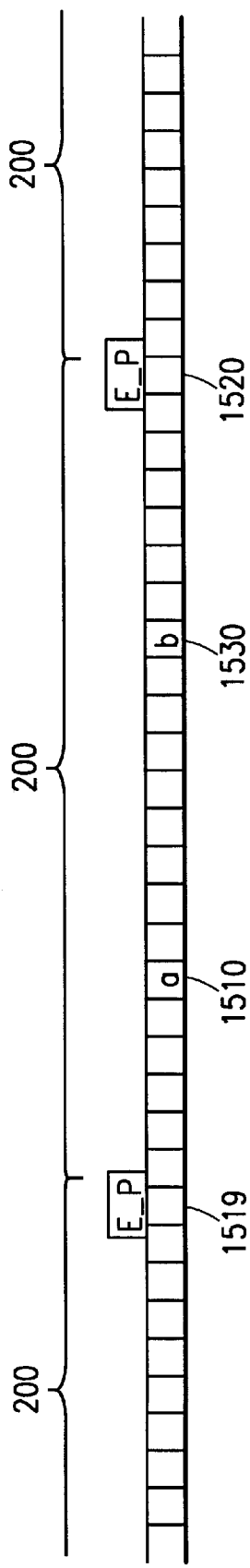
FIG. 15 is a linear representation of a page to be searched using the logical AND operator.

An operation of the index stream readers 60 with respect to the logical AND operation is described with reference to FIGS. 15–17. For example with reference to FIG. 15, a user desires to locate pages 200 including at least one occurrence 1510 of the word (or metawords) a and at least one occurrence 1530 of the word (or metaword) b. This could be expressed in a query as:

find all pages containing the words "vegetable" and "fruit."

Figure 16:
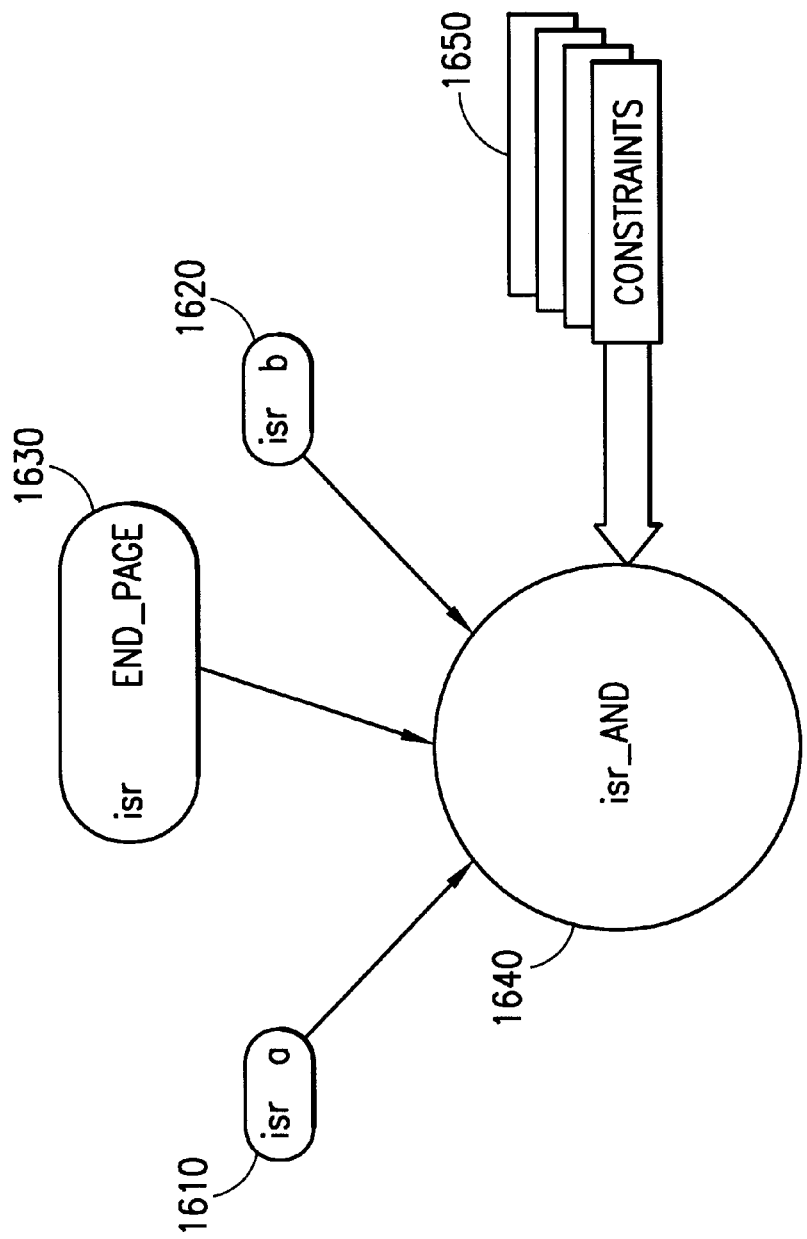
FIG. 16 is a flow diagram of basic index stream reader objects linked to each other by a compound stream reader which is subject to constraints.
Figure 17:
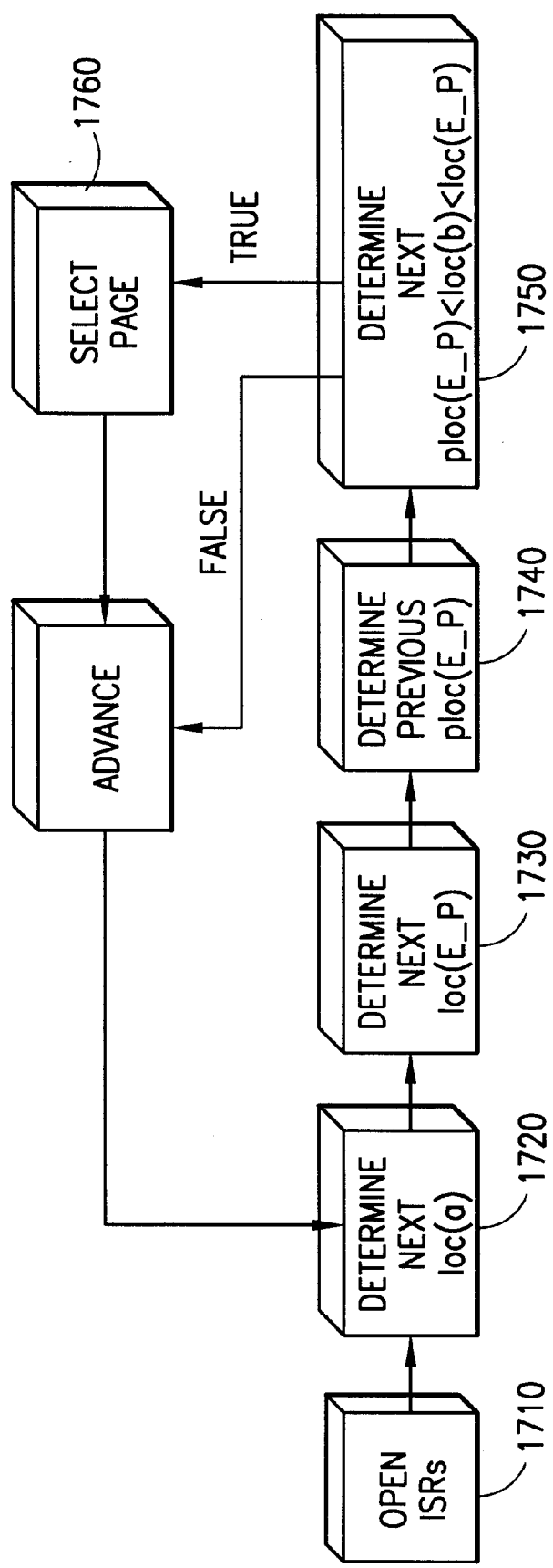
FIG. 17 is a flow diagram of a query search using the logical AND operator.

As shown in FIG. 16, open basic readers isr a 1610, isr b 1620, isr E_P 1530 for the metaword □END_PAGE□, as well as a compound isr_AND 1540 logically linking the ISRs 1610, 1620, and 1630, step 1710 of process 1700 of FIG. 17. After, the index stream readers have been opened, the methods of the isr_AND reader are referenced to perform the search. This will cause the methods of the basic stream readers linked by the isr_AND object to be referenced to find locations for the specified words.

Index Stream Reader Constraints

The isr_AND object 1640 is different from the other ISR objects in that it operates in conjunction with one or more "constraints" 1650. As defined herein, constraints give the isr_AND objects a powerful mechanism to rapidly scan through multiple location streams.

Recall, each unique word of the index is associated with one set of incrementally increasing locations, e.g., a location stream. Also recall, scanning locations of the compressed data structure 71 of FIG. 9 requires the sequential reading of each byte of every location for a particular word; for many words this can be millions of locations. This is required because of the delta value encodings. A next location can only be determined from a previous location.

Constrained Unidirectional Scanning

Because of the manner in which the locations are compressed, scanning the compressed data structure 71 can only proceed in one direction, without backing up. If the index 70 is searched at a lowest level, every byte must be read in sequential order. However, the sampled entries of the summary data structures 72–73 can be searched while skipping over many locations. In fact, the summary data structures can be processed by methods more efficient than sequential searching, for example, binary searching methods.

The constraints 1650 enable low-level (inexpensive) procedures to quickly traverse locations by first using the summary data structures 72–73 and then the compressed data structure 71 to reach a desired target location without having to invoke higher level (expensive) procedures, or uncompressing an excessive number of delta values. Constrained stream readers provide a substantial performance advantage for the search engine 140 of FIG. 1.

In a simple form, a constraint can be expressed as:

$$C(a) \leq C(b) \pm K,$$

where
C(a) means the current location of a word (or metaword) a,
C(b) means the current location of a word (or metaword) b; and
K is a constant.

To find words whose locations are next to each other, the value of K is 1, and the constraints can be:

$$C(a) \leq C(b)+1,$$

and $$C(b) \leq C(a)-1.$$

For words that are to be "near" each other, the value of K can be ten.

Alternatively constraints can also be in the form:

$$P(a) \leq P(b) \pm K,$$

$$C(a) \leq P(b) \pm K,$$

or $$P(a) \leq C(b) \pm K,$$

where P means the previous location of a, or b. Recall, some ISRs keep track of the previously determined location.

Handling Terminating Conditions

In order to correctly handle terminating conditions such as determining a previous location for the first location of a word, or a next location for the last location of a word, two additional indicators can be used in specifying constraints. For example:

$$C(b) \leq C^E(b) \pm K,$$

or $$P^B(b) \leq C(b) \pm K$$

where, $C^E$ means the index stream is allowed to locate a "next" location at the "end", or a previous location at the "beginning." This convention enables the processing of words or phrases associated with the first and last occurrence of the word, phrase, or group of words, e.g., a title.

General Form of Constraints

Therefore, more generally, the constraints can be expressed as the family:

$$C|P(a) \leq C|P(b) \pm K,$$

where the symbol "|" stands for logical OR.

The constraints 1650, in part, determine how the get_loc_limit method determines a next location for the isr_AND object. Logically, the constraints operate as follows.

Clearly, for a constraint to be satisfied, the value of the right side (loc(b)±K) must be greater than or equal to the value of the left side (loc(a)). This means that the current location of the right side stream, adjusted by K, must be at least equal to the location of the left side stream. If the constraint is unsatisfied, the right side stream is "behind."

Satisfying Constraints

The constraint could be satisfied by "backing-up" the left side stream. However, because of delta value compressing, it is only possible to move the streams forward. Therefore, the only way to satisfy a constraint is to advance the right side stream. A simple way to do this is to use the left side location as, at least, a minimal target location for the right side stream using the get-loc-limit method. This is intended to satisfy the constraint, although it may make other constraints false. Note, if a stream is at the last location, the scanning process can be terminated.

Favoring Selected Constraints

As stated before, most queries invoke multiple stream readers, each possibly using multiple constraints 1650. Therefore, by carefully deciding which of the constraints to satisfy first, the scanning of the index can be accelerated. For example, a constraint which moves the current location forward by many thousands, should be favored over one which only increases the current location by a small amount. When all constraints are satisfied, the query has been resolved for a particular page.

Now again with reference to FIG. 17, after opening the ISRs, in step 1720, determine, a next location (loc(a)) 1510 (FIG. 15) of the word a. Then, in step 1730 using the isr_E_P object 1630, determine a next location (loc(E_P)) 1520 of the metaword □END_PAGE□. In step 1740, determine the previous location (ploc(E_P) 1519 of the metaword □END_PAGE□ using, for example, the get_prev_loc method 1312 of the isr_E_P.

Then, in step 1750, determine a next location (loc(b)) of the word b constrained to be greater than the previous □END_PAGE□ location (ploc(E_P)) 1519, but less than or equal to the next □END_PAGE□ location (loc(E_P)) 1520. This constrained search can be performed by the get_loc_limit method 1325 using the locations 1519 of the previous END_PAGE metawords as the constraint values, then a test can be performed on the next loc(E_P) 1520.

Thus, a sample search for two words within the same page can be bounded by the constraints;

$P(E\_P) \leq C(a)-1$, and $C(a) \leq C(E\_P)$, for word a, and $P(E\_P) \leq C(b)-1$, and $C(b) \leq C(E\_P)$, for word b.

When all of these constraints are satisfied, a qualified page has been found.

These constraints are obviously dependent on how a specific implementation indicates page boundaries. Other constraints can be formulated for different page boundary designations.

Should the query include the further restriction that the word "cooking" (c) should be in a title field, the search can be conducted by opening the index stream reader objects for the word c, and the metawords □BEGIN_TITLE□ (B_T) and □END_TITLE□ (E_T).

Furthermore, the isr_AND object 1640 is supplied with the additional constraints:

$P(B\_T) \leq C(c)$, $C(c) \leq C(E\_T)$, and $C(E\_T) \leq C^E(B\_T)$.

Note the use here terminating indicators on the constraints to properly handle end-point conditions.

Finding Pages with Adjacent Query Words

Figure 18:
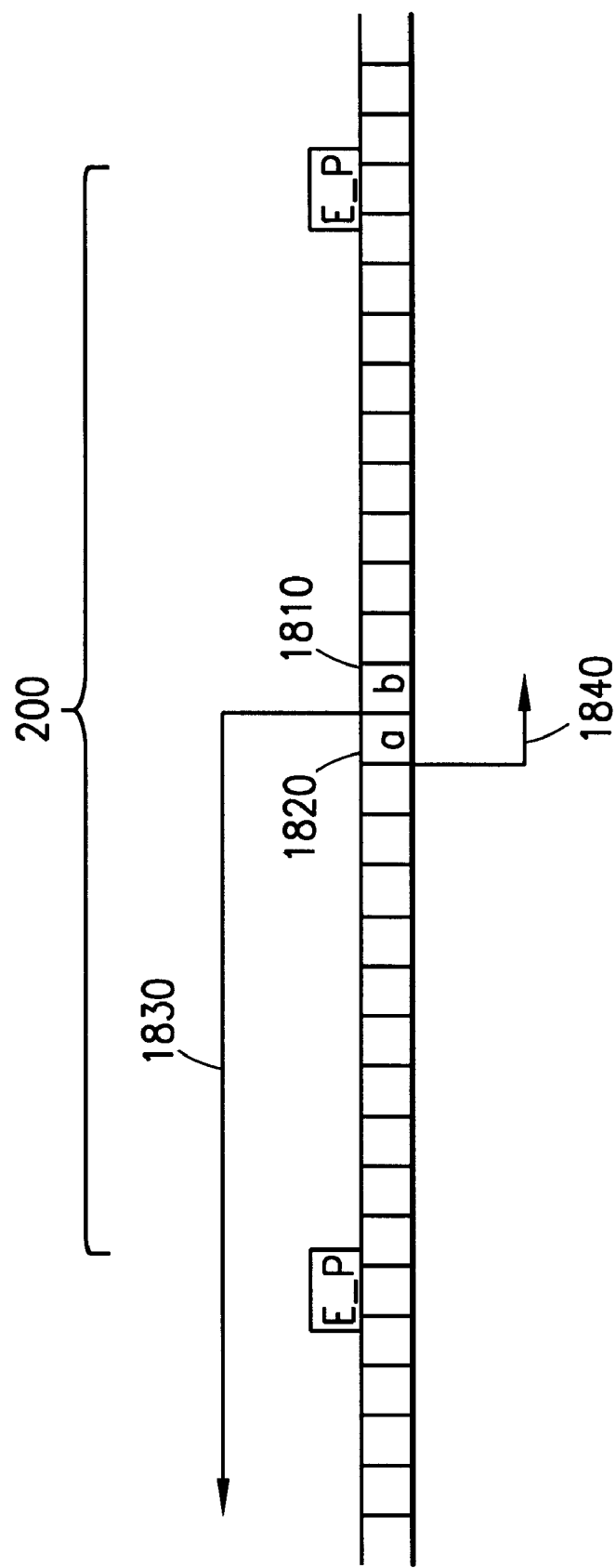
FIG. 18 is a linear representation of adjacent words.

FIG. 18 shows how the constraints 1650 of FIG. 16 can be used to further refine the selection of pages so that pages are only selected if the word b 1810 is immediately preceded by the word a 1820, e.g., the phrase "a b". Constraint 1830, e.g., $C(a) \leq C(b)-1$, specifies that the word a must occur somewhere before the word b. A constraint 1840, e.g., $C(b) \leq C(a)+1$, specifies that the word a must come at most one word before the word b. Satisfying both constraints demands that the words a and b be immediately adjacent in locations.

Finding Pages with Words Near Each Other

By making the constant value of the constraints larger than 1, e.g., ten, the NEAR operator can be implemented. For example, the constraints:

$C(a) \leq C(b)+10$, and $C(b) \leq C(a)+10$ locates words within 10 of each other. Note, the constraints do not specify the relative order of the words a and b.

Operation of isr_AND Index Stream Reader.

In general, with the isr_AND object, the operation is as follows. For any given set of current locations of the words of the input streams, determine if any one constraint is unsatisfied, and satisfy that constraint. Better performance can be obtained by selecting the constraint which is likely to advance the current location the farthest.

A constraint can be satisfied by calling get_loc_limit using the sum of the left side value and –K as the target location. As stated before, this may dissatisfy other constraints. Therefore, this process is repeated until all constraints are satisfied, which indicates a match, or until a terminating condition is reached. Note, the get_loc_limit may search the summary data structures 72–73 before the compressed data structure 71.

NOT Index Stream Reader

The isr_NOT method produces all locations where the specified word does not occur. Because of the potentially large number of locations which may qualify, the isr_NOT is designed to do a "lazy" evaluation of locations. Lazy means the identification of locations is deferred until a last possible moment. Typically, the isr_NOT reader is used with compound stream readers that match for a subset of END_PAGE locations.

Optimizing the Scanning of the Stream Readers

While processing queries, many constraints may need to be evaluated or satisfied in order to locate qualifying pages. In general, the time to resolve a query is proportional to how fast the index can be searched for a given number of ISRs. Therefore, each ISR of FIG. 13 also maintains the estimated_overshoot value 1315. The overshoot is an estimate at a search rate.

Overshoot

The estimated_overshoot 1315 is determined as follows. Each time that an ISR determines a new current_location 1313 using the get_loc_limit method 1325, the running average number of locations advanced beyond the initial target location is determined. The target location is specified as an argument for the get_loc_limit method. The estimated_overshoot 1315 is a relative indication of how "fast" a particular index stream reader is advancing through the locations.

For example, if at any given moment there are a number of unsatisfied constraints, the best constraint to satisfy first is the one which will maximize the current location of the isr advanced. The current location is maximized when the sum of the constraint's target value (that is, the value of the left-hand side of the constraint, minus K) and the estimated_overshoot 1315 of the stream of the right-hand side is a maximum.

Distinguished Streams

It is also important to correctly handle queries which on their face may seem to be identical. For example, the queries:

find all pages containing both the words a and b; [1]

find all a where b is also in the same page; and [2]

find all b where a is also in the same page. [3]

All three queries fundamentally use the ISRs, isr_a, isr_b, and isr_E_P and use the same constraints. However, it is important that the correct stream is selected for advancement when all constraints are satisfied, e.g., when a qualifying page or record has been identified.

For query [1,] the END_PAGE index stream needs to be advanced first e.g., get_next E_P, since the user is interested in "pages." For query [2], the a stream should be first advanced when all constraints are satisfied, otherwise matches are going to be erroneously missed. For query [3], the b stream is first advanced if all constraints are satisfied. The stream that is being advanced first is called the distinguishing stream. If this convention is followed, qualifying pages will not be missed.

Using Big Page Attributes

The processing of queries can further be accelerated by taking note of the fact that a relatively small number of pages are considerably larger than most pages. Therefore, relatively large pages have the additional attributes of □BEGIN_BIG□ and □END_BIG□. Performance can be improved by focusing on the "big" metaword streams, because the "big page" attributes occurs relatively infrequently compared to the □END_PAGE□ attribute.

The improvement, which assumes that big pages include more than 16K words, is implemented as follows. During query processing consider the following two additional constraints, assuming that the query is looking for a match on the words a and b:

$$C(a) \leq C(b) + 16384,$$

and $$C(b) \leq C(a) + 16384.$$

These two constraints require that the words a and b must be within 16384 locations of each other. This is very similar to the constraints that would be used in resolving a proximity query. Since these constraints do not require an evaluation of the isr_E_P, the index can be traversed much more rapidly.

During operation, a determination is made if the words a and b are within a "big" page, e.g., a page with more than 16K words. If this condition is false, then the words must be in a "small" page. In this case, enable the above two constraints. Otherwise, if the condition is true, then disable the two constraints.

Since "big" pages occur relatively infrequently, there will only be a relatively small number of locations associated with the metawords for the attributes □BEGIN_BIG□ and □END_BIG□. Consequently, the estimated_overshoot for the stream readers associated with these metawords will be relatively high, for example, at least 16K. It has been determined that the addition of these two constraints alone can speed up traversal of the index 70 by as much as a factor of two.

Queries Using Range-Based Values

The index 70, and processes which operate thereon, not only can be used to search for "words" having discrete literal values as described above, but also to locate words within a range of numeric values, such as integers. For example, the page attributes □SIZE□ 253 can be expressed as an integer value, as can the attribute □DATE□ 254, e.g., as a "Julian" date. There are advantages in allowing users to state a query generally in the form of:

find a word a in pages which were generated after Dec. 12, 1995, or find a word a in pages including 57 to 70 words.

Range-Based Metawords

Figure 19:
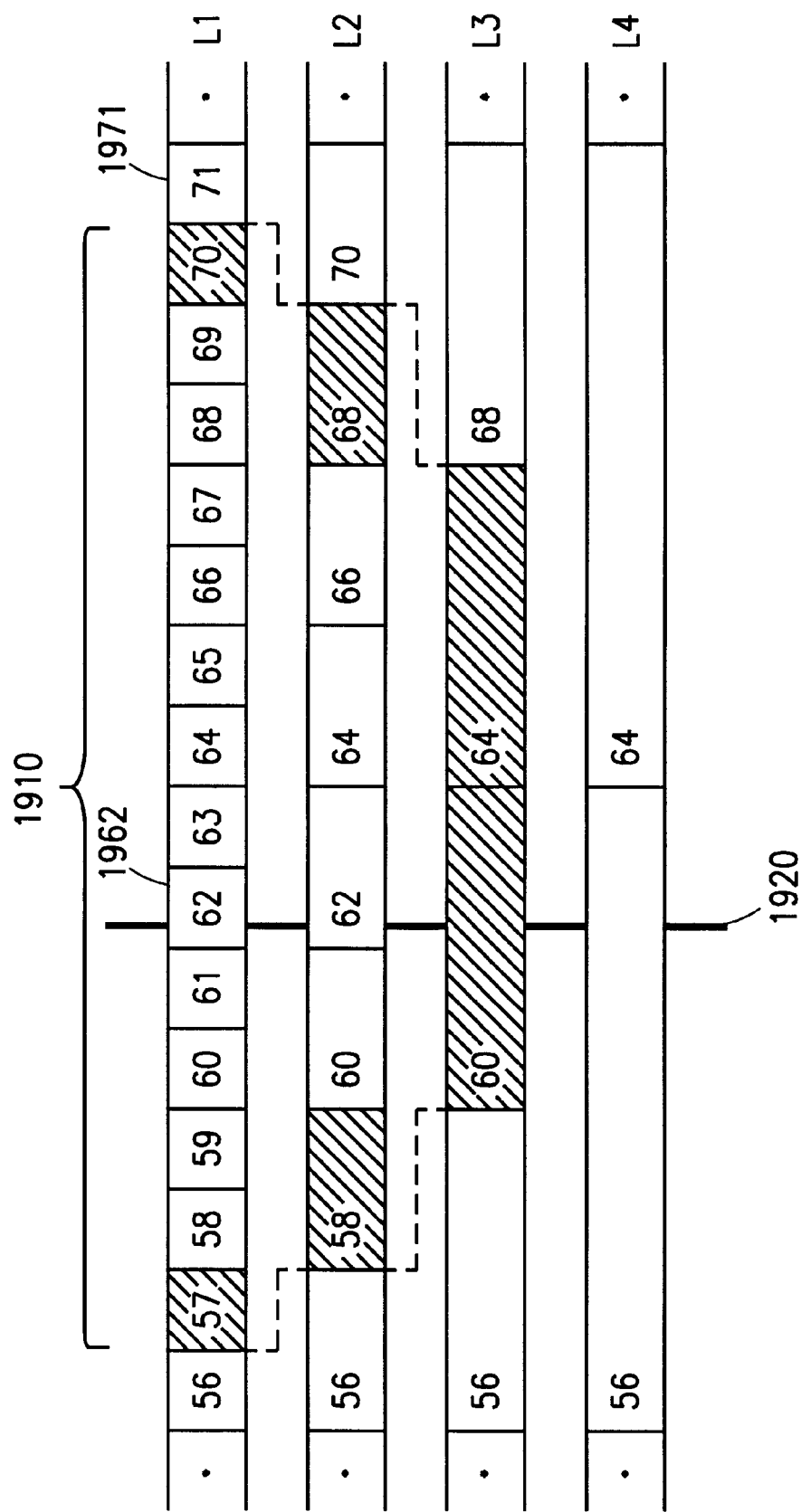
FIG. 19 is a block diagram of range-based metaword values.

The number line begins with integers 1 and 2, and as shown in FIG. 19, has a portion . . . , 56, 57, . . . ,70, 71, . . . , and so forth. The integers represent values on which range-based query operations are desired, e.g., dates, and page sizes. The ranges can be selected from an interval of a predetermined size, e.g., 16, 4K, 512K, etc.

The predetermined interval can be used to generate a plurality of sets of subintervals. For example, a first set of subintervals L1–L4, as shown in FIG. 19. The first set, e.g., level L1 has one subinterval for each integer value.

The subintervals can be represented by literal metawords, e.g., 1_1, 2_1, . . . , 56_1, 57_1, . . . , 70_1, 71_1, etc, where the first number represents the starting value, and the second number length of the interval. For clarity, the usual "□" designation of metawords is not used.

The next subset of intervals, for example, the intervals of the level L2 shows a groups of adjacent subintervals of the previous set, e.g., level L1. In one grouping, the size of the subintervals doubles for each next set, until the entire interval is covered in one subinterval, e.g., 1, 2, 4, 8 etc. The combinations of the second level L2 can be represented by the metawords 2_2, 4,_2, . . . , 56_2, 58_2, . . . ,70_2, 71_2, and so forth.

A next set, level L3, can then be encoded by metawords representing the adjacent groups of the previous level 2 as 4_4, 8_3, . . . , 56_3, 60_3, 64_3, 68_3, size "four." Additional levels can be encoded 8_4, 16_4, . . . , 56_4, 64_4, . . . , and so forth. The number of levels needed to encode a range of N integers, with doubling of sizes, is a function of $\log_2 N$, where N is the number of possible rage-based integer values to be encoded.

During parsing of the pages by the parser 30, if a word 1962 with a range attribute is recognized, encode the value of the word ("62") as follows. First, generate a [location, word] pair as one normally would for any word, for example, the pair [location, 61]. Second, generate range-based metawords pairs for all possible subintervals which include the word. For example, using FIG. 19 as a reference, the vertical line 1920 passes through the word "62" and all combinations which include word of levels L1–L4.

Therefore, the additional metaword pairs which will be generated include [location, 62_1], [location, 62_2],

[location, 60_3], and [location, 56_4], all for the same location as the word "62". Similarly, the word ("71") 1971 could be encoded as [loc, 71], [loc, 71_1], [loc, 70_2], [loc, 68_3], and [loc, 64_4], and so forth. The succeeding values for each level can be determined by bit shift and bit clear operations using the literal values.

During operation, a range-based query specifies:

find all pages having a size in the range 57 through 70 bytes.

The range "57–70" can be converted to a Boolean search for the range-based metawords in the desired range. That is, search the word entries corresponding the subintervals whose concatenation exactly spans the range of the search term. If the selected metawords which exactly span the range are minimized, then the search time is also minimized since a minimum number of f index stream readers need to be used.

Therefore, the metawords which are to be used for scanning the index are selected from the "bottom" level up. For example, the metawords 57_1, 58_2, 60_3, 64_3, 68_2, and 70_1 exactly span the range "57–70" as shown by the cross hashing.

With a $\log_2$ based encoding at most $2L-1$ metawords need to be searched if L levels are used for the expression of the range-based values. Julian date ranges can adequately be handled with sixteen levels of encoding, e.g., at most thirty-one metawords during a query. It should be understood that this technique could be expanded to handle fixed-point numbers as well. Other groupings of adjacent values can also be used, for example threes, fours, etc.

As an advantage of this encoding, uniform data structures and interfaces, e.g., the index 70 and stream readers 60, can be used for encoding and searching a range of values without a substantial increase in data storage and processing time. In addition, range-based searches benefit from the optimization improvements implemented for discrete-valued searches.

The Ranking of Qualified Pages

The ISRs 60, as described above, produce a list of identified pages 200 which are qualified by the queries 52. Since the number of pages indexed by the search engine 140 can be rather large, it is not unusual that this list may include references to tens of thousands of pages. This is frequently the case for queries composed by novice users because of the rather imprecise nature in which their queries are composed.

Therefore, there needs to be a way to rank order the list in a meaningful manner. A modified collection frequency weighing technique can be used to rank the pages. Then, the list can be presented to the users in a rank order where the pages having a higher rank are presented first.

Word Weighing

To perform the ranking, each indexed word is assigned a weight w. A score W for a page is the sum of the weight w for each occurrence of a word specified in the query which also appears, or in the case of the NOT operator does not appear, in a qualified page. Thus, should a page include all words, a higher score W is produced. Also, should a word with a relatively high weight appear frequently in a qualified page, that page will receive a yet higher score. Low weight words will minimally contribute to the score of a page.

Figure 20:
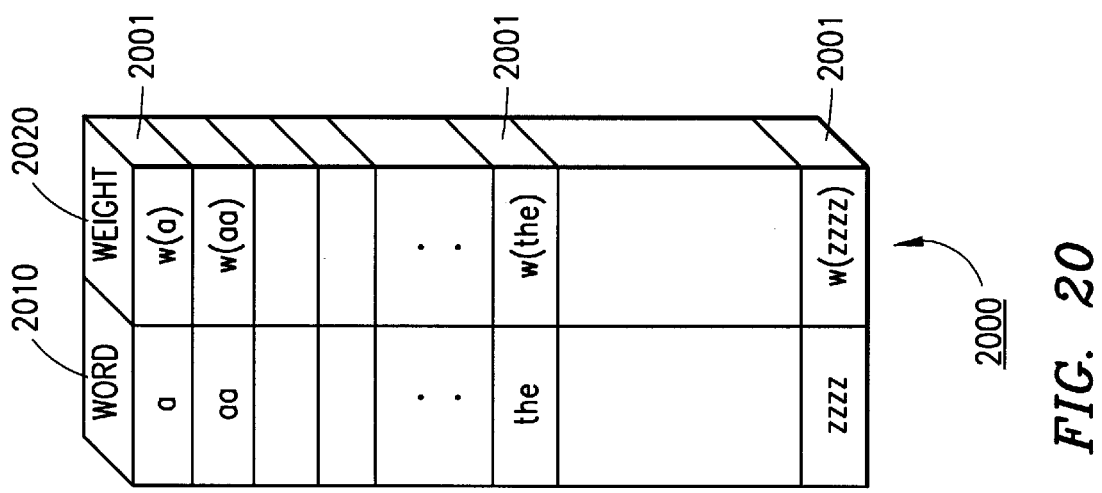
FIG. 20 is a table for storing word weights.

As shown in FIG. 20, a word weighing table 2000 can be maintained. The table 2000 contains an entry 2001 for each unique word 2010 of the index 70. Associated with each word 2010 is its weight w 2020, e.g., w(a), w(aa), and so forth. One way to determine the weight w of a word in the index 70 can be:

$$w = \log P - \log N,$$

where P is the number of pages indexed, and N is the number of pages which contain a particular word to be weighed. Then, should a particular word, for example "the," appear in almost every page, its weight w will be close to zero. Hence, commonly occurring words specified in a query will contribute negligibly to the total score or weight W of a qualified page, and pages including rare words will receive a relatively higher score.

Dealing with Common and Rare Words

One problem with this technique is that a query may include both common and rare words. For example, a query is stated as:

find all pages including the words "an" and "octopus."

Finding the pages including the word "octopus" will proceed quickly. However, finding the pages which include the word "an" will require a substantial amount of processing because words such as "an" may appear at millions of locations.

Word Lists

Figure 21:
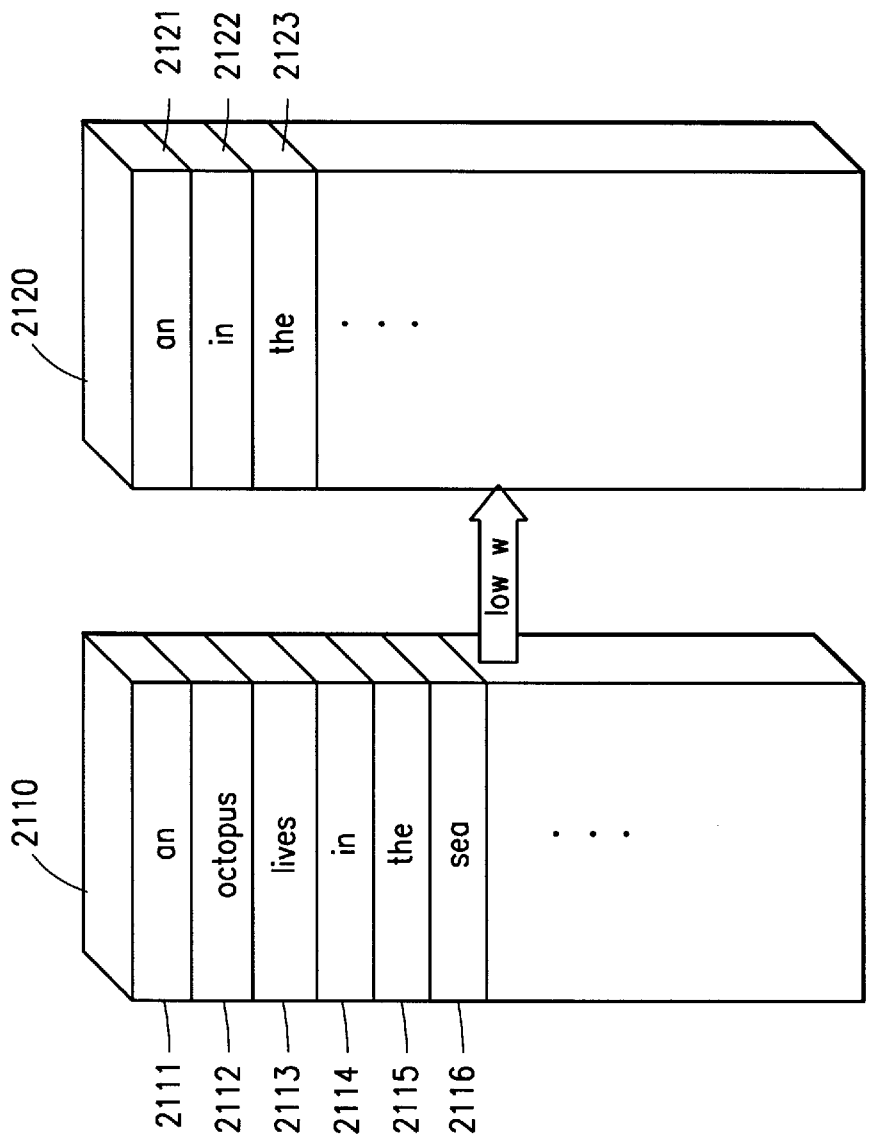
FIG. 21 is a block diagram of query word lists.

Therefore, as shown in FIG. 21, first and second related query word lists 2110 and 2120 are maintained for each query processed. Initially, the first list 2110 includes entries 2111–2116 for each word specified in a query, for example:

find all pages including the words "an octopus lives in the sea." In this case, the list 2110 initially includes an entry for every basic index stream reader which is used to read locations where the word x appears.

Ranking List

Figure 22:
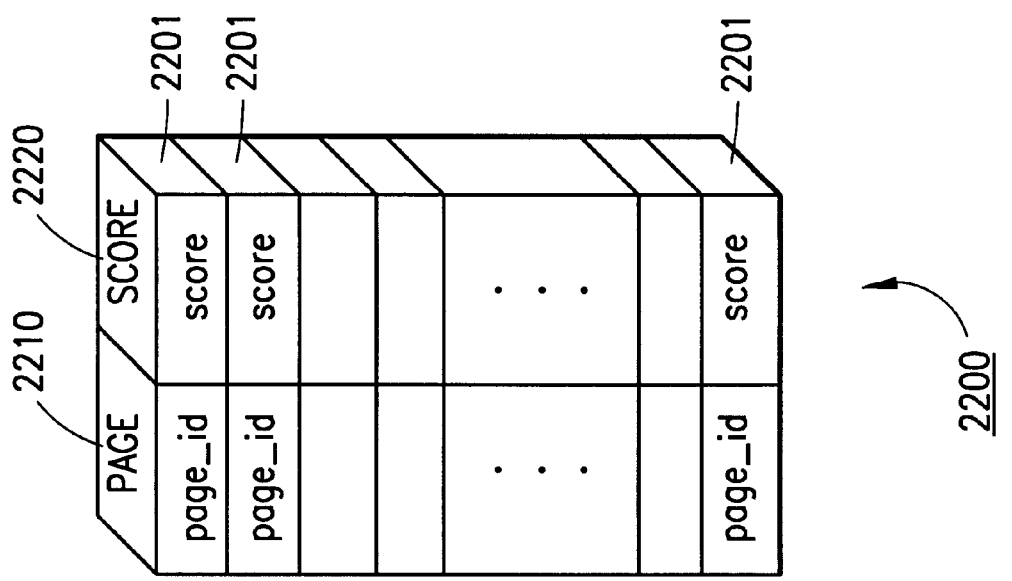
FIG. 22 is a block diagram of a page ranking list.

In addition, as shown in FIG. 22, a ranking list 2200 of qualified pages is maintained. The ranking list 2200 includes one entry 2201 for each qualified page. Each entry 2201 includes an identification (page_id) 2210 of a qualified page, and a score (W) 2220 associated with the identified page. The entries 2201 are maintained in a rank order according to the scores 2220.

The Top 500

The number of entries 2201 in the list 2200 can be limited to some predetermined number, for example, five hundred. This means that only the pages having the "top 500" scores will be presented to the user. It should be understood, that this number can vary, depending on a specific implementation, or perhaps, user supplied parameters.

During operation, identifications 2210 and scores 2220 of qualified pages are entered into the list 2200 in W rank order. When the ranking list 2200 fills up, it contains 500 entries 2201. At this point, a determination can be made to see if it is possible for any of the words 2111–2116 of the first list 2210 having a relative low weight w, e.g., "an," "in," and "the" could possibly promote any as yet unqualified page to the "top 500" list 2200.

For example, if the score of the lowest ranked page is 809,048, and the weight of the low weight words is about 0.0000001, then it is impossible for any of the low weight words to promote an as yet unidentified page to the "top 500" list 2200.

In this case, the words with a low weight w, e.g., "an" 2111, "in" 2114, and "the" 2115 of the list 2110 are deleted (X) from the first list 2110 and entered as entries 2121–2123 of the second list 2120. Now, the scanning of the index can proceed with a focus on the words 2112, 2113, and 2115 remaining in the first list 2110.

If a page is subsequently qualified because it includes a highly weighted word, then the weights of the words of the second list 2120 are still taken into consideration in order to determine the correct score W of the page. However, index stream readers scanning for locations of low weight words will be disabled while first locating pages including words having a relatively high weight w. Partitioning words into multiple lists 2110 and 2120 according to their weight greatly improves the performance of the search engine 140.

Concurrently, it also possible to limit the amount of weight a high frequency word (low weight) can contribute to the scores 2020 of any one page. Thus, pages which have been deliberately constructed to contain a large number of low weight words will not necessarily be promoted to the top 500 list 2200.

However, with this approach it may still take a substantial amount of processing to fill the "top 500" ranking list 2200. This is due to the fact that the list 2200 will initially be filled with entries of qualified pages whose scores may be derived from low weight words.

Statistical Projection Ranking

As a refinement, a statistical projection technique can be employed to accelerate the movement of low weight words from the first list 2110 to the second list 2120. The statistical projection is based on the assumption that in an extremely large index the relative frequency of occurrence of the various words over the pages is constant. For example, the frequency of occurrence of the words "the" in a first small fraction of the indexed pages 200 is the same as in the remaining pages.

Therefore, while processing a query, as soon as a small fraction, for example 3%, of the index 70 has been processed, a statistical projection is made to see if any word on the first list 2110 could solely promote a page to the top 500 list 2200 based on the scores obtained for the first 3% of the index. In this case, the low weight word of the first list 2110 is immediately moved to the second list 2120 even if the top 500 list has not yet been filled with entries 2201.

Safety Margins for Statistical Projection

As a further refinement, the following safety margin can be built into the statistical projection. After 3% of the index 70 has been processed, a determination can be made to see if the top 500 list 2200 is at least, for example, 15% filled, e.g., the list 2200 includes at least 75 entries. This will make it highly likely that by the time the end of the index is reached, the ranking list 2200 could probably have about 2475 (100/3×75) entries. This number is much larger than 500. Consequently, moving words from the first list 2110 to the second list 2120 based on a small sample will more than likely produce the correct result, particularly if the "small" 3% sample is based on words indexed from perhaps a million pages or more.

By the time that all pages of the index have been searched during a sequential scan, it can easily be determined if the statistical projections were made correctly. If not, the query can be reprocessed with increased safety margins.

A further improvement can be made for queries which contain more than one word. In this case, while determining the score for a qualified page based on the weights of a low frequency word, also determine which words of the second list 2120 have not yet been detected in the page. Then, determine if the score would qualify the page for the top 500 list 2120 even if the page would include any or all of the low frequency words. If it would not, then the page can be discarded immediately without having to search for low weight words.

Furthermore, if the entries of the lists 2110 and 2120 are maintained in an order according to their weights w, then words which are more likely to produce a qualifying score will be processed first. Note, words with a greater weight are also ones with fewer locations to process, this increases the chance that many locations of "expensive" to process low weight words need to be processed at all.

Other Rankings

So far, the ranking of qualified pages for presentation to the users has been based on processing with the index stream reader isr__E__P. That is, the score for a particular qualified page is determined from the words having locations less than or equal to the location of a next END__PAGE attribute, having a location greater than the location of a previous END__PAGE. It is also possible to combine ranking operations with a Boolean query, that only pages or records that match the Boolean query are ranked.

Optimization of Index in Response to Queries

Even with the efficiencies of the index structures and processes as described above, it may still be the case that some queries consume a substantial number of processing cycles. This may be a particular problem if a phrase, e.g., a concatenation of immediately adjacent words, of a slow-to-process query appears frequently. This is normal for the Web, "hot" topics get a lot of attention.

For example, a frequent and slow to process query may include the terms Netscape 1.2. Recall, the parser 30 would parse the term 1.2 as two words separated by a punctuation mark (.). Because the words "1" and "2" separately will occur relatively frequently, a large number of locations will be associated with these words.

The query module 50 has feed-back capabilities. This means, as an advantage, that the query module 50 itself can also generate new entries for the index 70. This feature can be implemented as follows.

The Query Journal

Figure 23:
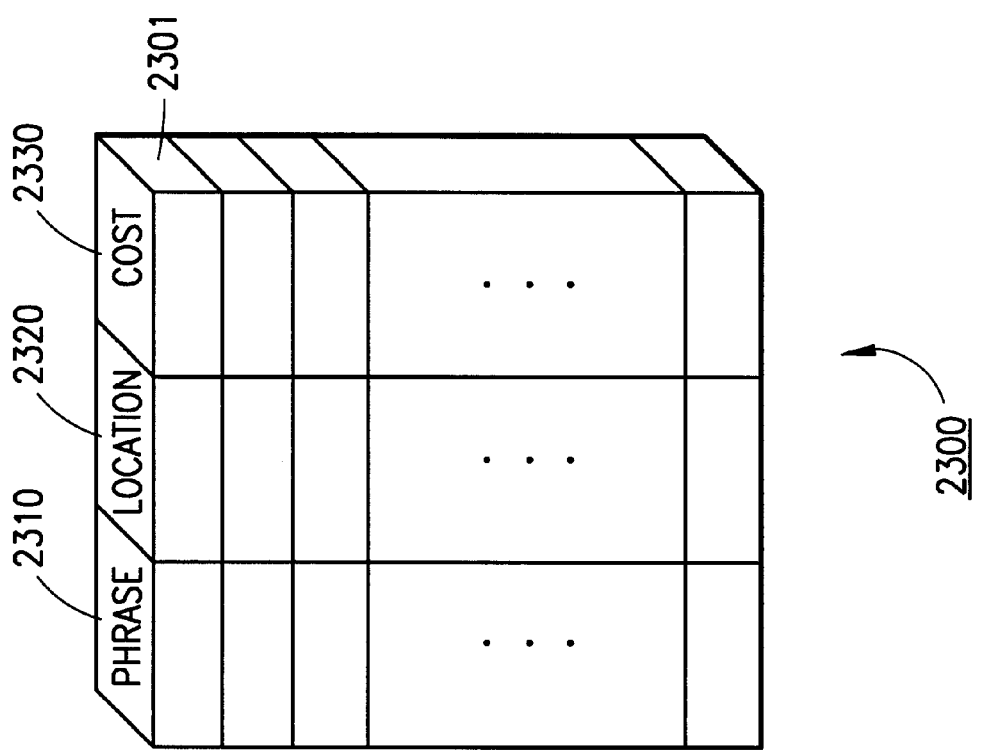
FIG. 23 is a block diagram of a query phrase log.

As shown in FIG. 23, the query module 50 maintains a journal or logging file 2300 while operating. Each entry 2301 of the log 2300 records a phrase 2310, a location 2320 of the phrase, and the cost 2330 of processing the phrase. Periodically, perhaps once a day, the log 2300 is processed. For phrases having a relatively high processing cost, e.g., the phrase "1.2", a new metaword is dynamically placed in the index 70. The metaword is a concatenation of the words of the phrase, for example, □1.2□,. The location can be the location associated with the first word of the phrase.

Once the synonymous "phrase" metaword has been placed in the index 70, searches for the phrase can be greatly accelerated since only a single ISR, for example, isr__1.2, needs to used. Prior to the existence of the dynamically generated metaword, at least three ISRs (isr__1, isr__2, and isr__AND (isr__1, isr__2), plus several constraints were required in order to resolve the term "1.2." Also, the word "1.2" will have fewer associated locations.

After the metaword has been placed in the index 70, the parser 30 can also recognize entries placed in the index 70 by the query module 50, in addition to indexing the words of the phrase separately as it normally would. Therefore, as an advantage, the search engine 140 is self-optimizing in response to the query load.

Duplicate Pages

As stated above, the search engine 140 is particularly suited for indexing a large number of information records, such as the many millions of pages 200 of the World Wide Web. Because there are so many pages, and because it relatively easy to copy pages, the same page may frequently appear at different addresses as "duplicate" pages.

A duplicate page is defined as a page having a different address (URL), but having an identical fingerprint as a previously indexed "master" page. It is estimated that as many as 25% of the Web pages may be duplicates of other pages. Therefore, the search engine 140 is provided with means for economically handling duplicate pages.

Fingerprints

Figure 24:
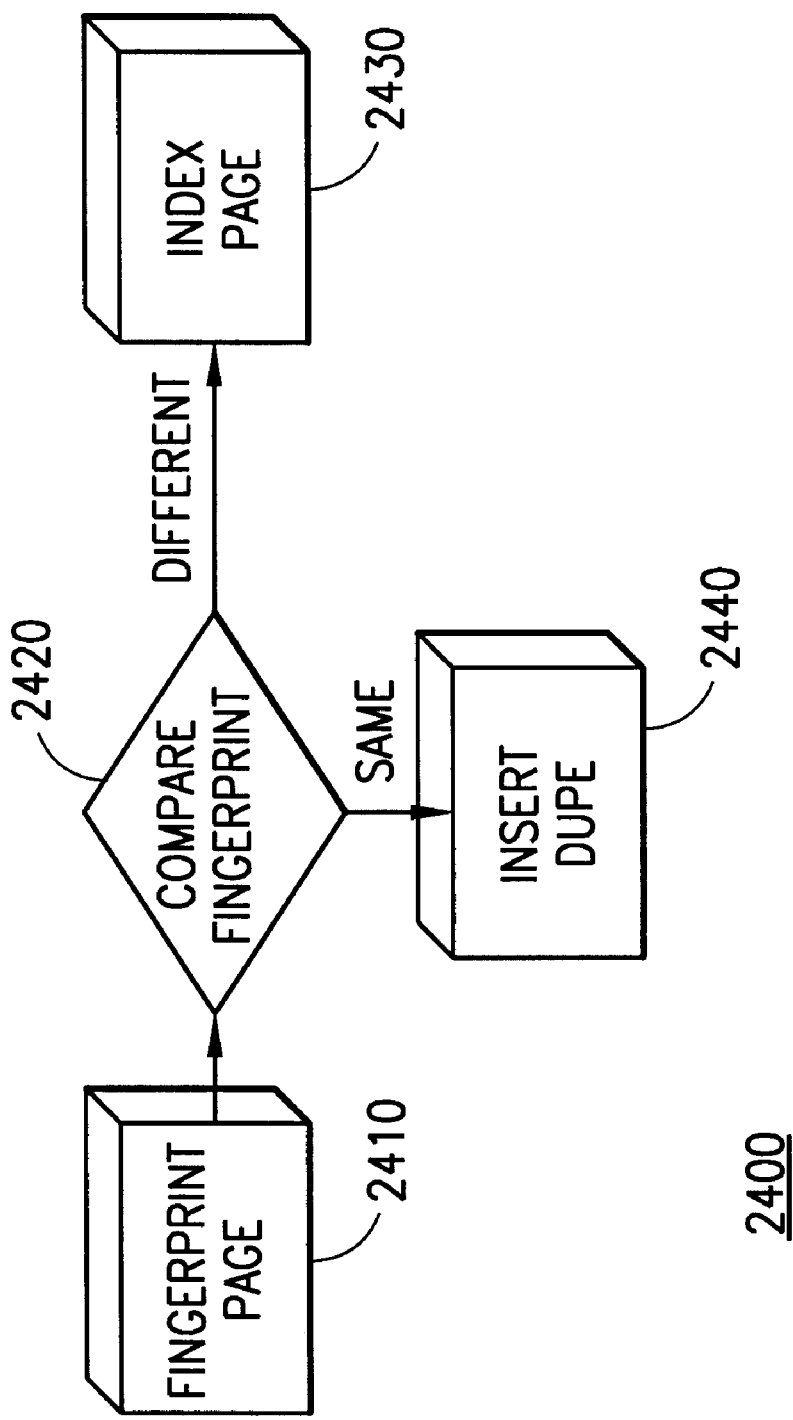
FIG. 24 shows a process for detecting duplicate pages.

As shown in FIG. 24, while parsing a current page, in step 2410 of a process 2400, first determine the fingerprint 255 of the current page. In step 2420, compare the fingerprint 255 of the current page with the fingerprints of previously indexed pages. Note, with the index structure 70 as described above, this is can be done by performing a search in the index 70 for the metaword which expresses the value of the fingerprint.

If there is no identical fingerprint entry in the index 70, then the current page is different, and the current page can be parsed and indexed as a master page in step 2430. Otherwise, if the current page is a duplicate, e.g., it has the same content as a previously indexed page, then, generate the pairs, [location, □FINGERPRINT□], and [location, □ADDRESS□] in step 2440. The □FINGERPRINT□ metaword can be recognizably marked to indicate that it is a duplicate, and not a master. Because only one copy of a master page is indexed, managing duplicate pages which are deleted, or no longer available, becomes a problem.

Deleting Duplicate Pages

Figure 25:
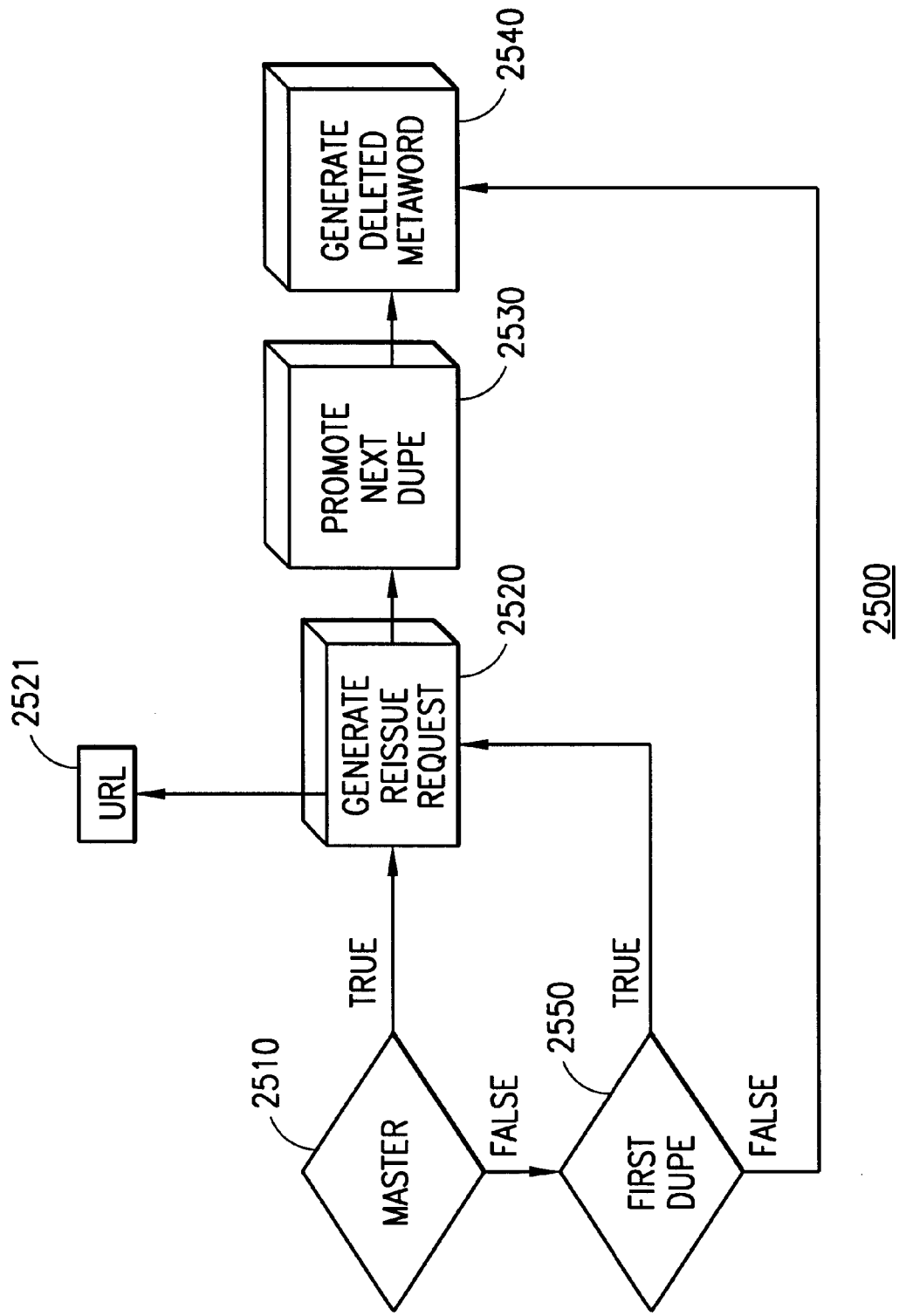
FIG. 25 is a flow diagram of a process for deleting pages.

FIG. 25 shows a process 2500 for deleting pages. In step 2510, determine if the page to be deleted is a master page. If true, then generate a reissue request 2521 for the automated browser 20 of FIG. 2 using the address (URL) of the next recorded duplicate page. Then, in step 2530, promote the next duplicate page to be a master page. In step 2540, generate a "deleted" metaword pair [location, □DELETED□], where location is the location of the last word of the page to be deleted. Otherwise, if false, e.i, this is not a master page, then in step 2550, determine if the page to be deleted is the next recorded duplicate of the page to be deleted and there is no master page, proceed with step 2520 if true. Otherwise, if false, proceed with step 2540.

Reissue Requests

The intent of the reissue request 2521 is to retrieve a copy of the page to be deleted, then the content of the retrieved copy can be reindexed. Note that there may be several reissue requests outstanding for a particular deleted page. This is because the behavior of the Web is undeterministic.

Requests may not be honored, sites storing copies of deleted pages may become unavailable, or the requests or replies to the requests are lost. Pages previously available may move behind a firewall at a later time. That is, delivery of pages over the Web is not guaranteed. Also, a duplicate page can be deleted before a copy of the master page can be successfully retrieved.

Dealing with Responses to Reissue Requests

Figure 26:
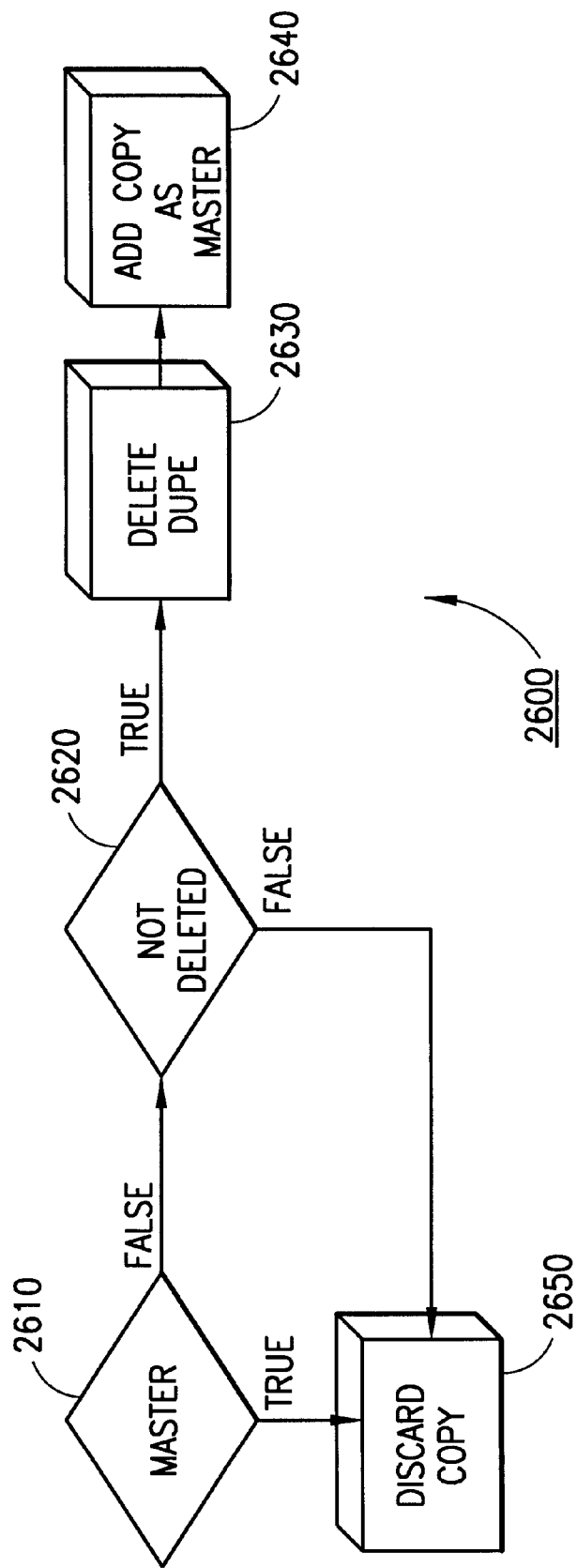
FIG. 26 is a flow diagram of a process for indexing reissue pages.

FIG. 26 shows a procedure 2600 for correctly processing copies of pages received in response to reissue requests 2521 generated by the procedure 2500 of FIG. 25. In step 2610, determine if there is a master for the copy. If false, then determine if the next duplicate of the copy is not deleted in step 2630. If true, then in step 2630, delete the duplicate page, and add the copy as the master in step 2640. If a master page already exists when the copy is retrieved, discard the copy in step 2650. This can happen when several reissue requests are generated before the master page is reconstructed.

Although specific features of the invention are shown in some drawings and not others, this is only for the convenience of describing each feature. Those skilled in the prior art will appreciate that the invention may be practiced in other ways while still remaining within the scope and spirit of the appended claims.

I claim:

1. A method for encoding a digital value in an index of a database, the method comprising the steps of:

identifying a digital value representing a difference between a pair of entries in the database;

storing a first indicator in a first bit of a first byte in the index and the digital value in remaining bits of the first byte if the digital value can be expressed in the remaining bits of the first byte; and storing a second indicator in the first bit of the first byte in the index, a third indicator in a second bit of each of a required number of subsequent bytes in the index except for a fourth indicator in the second bit of a last required subsequent byte, and the digital value in remaining bits of the first byte and the required number of subsequent bytes if more than the remaining bits of the first byte are required to express the digital value, the required number of subsequent bytes being the number of subsequent bytes that are required to express the digital value.

2. The method of claim 1, wherein the first indicator is a logical zero, the second indicator is a logical one, the third indicator is a logical one, and the fourth indicator is a logical zero.

3. The method of claim 1, wherein the first bit is the least significant bit of the first byte in the index, the remaining bits of the first byte are the most significant bits of the first byte in the index, the second bit is the most significant bit of the subsequent bytes in the index, and the remaining bits of the subsequent bytes are the least significant bits of the subsequent bytes in the index.

4. The method of claim 3, further comprising the step of:

determining the digital value by shifting the most significant bits of the first byte in the index by one bit if the digital value can be expressed in the most significant bits of the first byte in the index.

5. The method of claim 3, further comprising the step of:

determining the digital value by shifting the most significant bits of the first byte in the index and the least significant bits of a second byte in the index by one bit if the digital value can be expressed in the most significant bits of the first byte in the index and the least significant bits of the second byte in the index.

6. The method of claim 3, further comprising the steps of:

identifying an initial value;

if the first byte in the index contains a logical zero in the least significant bit, determining a next value by adding the most significant bits of the first byte in the index to the initial value; and if the first byte in the index contains a logical one in the least significant bit, determining a next value by adding the most significant bits of the first byte in the index and the least significant bits of the required number of subsequent bytes in the index to the initial value.

7. A method for encoding a digital value, the method comprising the steps of:

identifying a digital value that can be expressed in binary code;

storing a first indicator in a first bit of a first byte and the digital value in remaining bits of the first byte if the digital value can be expressed in the remaining bits of the first byte; and storing a second indicator in the first bit of the first byte, a third indicator in a second bit of each of a required number of subsequent bytes except for a fourth indicator in the second bit of a last required subsequent byte, and the digital value in remaining bits of the first byte and the required number of subsequent bytes if more than the remaining bits of the first byte are required to express the digital value, the required number of subsequent bytes being the number of subsequent bytes that are required to express the digital value.

8. The method of claim 7, wherein the first bit is the least significant bit of the first byte, the remaining bits of the first byte are the most significant bits of the first byte, the second bit is the most significant bit of the subsequent bytes, and the remaining bits of the subsequent bytes are the least significant bits of the subsequent bytes.

9. The method of claim 7, wherein the first indicator indicates that the digital value can be expressed in the first byte, the second indicator indicates that the digital value can not be expressed in the first byte, the third indicator indicates that at least one additional byte is required to express the digital value, and the fourth indicator indicates that no additional bytes are required to express the digital value.

10. A method for encoding a digital value, the method comprising the steps of:

identifying a digital value that can be expressed in binary code;

storing a first indicator in a first bit of a first byte, a second indicator in a second bit of a second byte, and the digital value in remaining bits of the first byte and the second byte such that the digital value can be determined by reading the first byte and the second byte without by clearing any bits.

11. The method of claim 10, wherein the first bit is the least significant bit of the first byte, the remaining bits of the first byte are the most significant bits of the first byte, the second bit is the most significant bit of the second byte, and the remaining bits of the second byte are the least significant bits of the second bytes.

12. The method of claim 11, wherein the digital value is determined by shifting the most significant bits of the first byte and the least significant bits of the second byte by one bit.

13. The method of claim 10, wherein the first indicator indicates that the digital value can not be entirely expressed in the first byte, and the second indicator indicates that no additional bytes are required to express the digital value.

14. An apparatus for encoding a digital value in an index of a database, the apparatus comprising:

a first processor for identifying a digital value representing a difference between a pair of entries in the database;

a first storage device for storing a first indicator in a first bit of a first byte in the index and the digital value in remaining bits of the first byte if the digital value can be expressed in the remaining bits of the first byte; and a second storage device for storing a second indicator in the first bit of the first byte in the index, a third indicator in a second bit of each of a required number of subsequent bytes in the index except for a fourth indicator in the second bit of a last required subsequent byte, and the digital value in remaining bits of the first byte and the required number of subsequent bytes if more than the remaining bits of the first byte are required to express the digital value, the required number of subsequent bytes being the number of subsequent bytes that are required to express the digital value.

15. The apparatus of claim 14, wherein the first indicator is a logical zero, the second indicator is a logical one, the third indicator is a logical one, and the fourth indicator is a logical zero.

16. The apparatus of claim 14, wherein the first bit is the least significant bit of the first byte in the index, the remaining bits of the first byte are the most significant bits of the first byte in the index, the second bit is the most significant bit of the subsequent bytes in the index, and the remaining bits of the subsequent bytes are the least significant bits of the subsequent bytes in the index.

17. The apparatus of claim 16, further comprising:

a second processor for determining the digital value by shifting the most significant bits of the first byte in the index by one bit if the digital value can be expressed in the most significant bits of the first byte in the index.

18. The apparatus of claim 16, further comprising:

a second processor for determining the digital value by shifting the most significant bits of the first byte in the index and the least significant bits of a second byte in the index by one bit if the digital value can be expressed in the most significant bits of the first byte in the index and the least significant bits of the second byte in the index.

19. The apparatus of claim 16, further comprising:

a second processor for identifying an initial value;

if the first byte in the index contains a logical zero in the least significant bit, a third processor for determining a next value by adding the most significant bits of the first byte in the index to the initial value; and if the first byte in the index contains a logical one in the least significant bit, a fourth processor for determining a next value by adding the most significant bits of the first byte in the index and the least significant bits of the required number of subsequent bytes in the index to the initial value.

20. An apparatus for encoding a digital value, the apparatus comprising:

a first processor for identifying a digital value that can be expressed in binary code;

a first storage device for storing a first indicator in a first bit of a first byte and the digital value in remaining bits of the first byte if the digital value can be expressed in the remaining bits of the first byte; and a second storage device for storing a second indicator in the first bit of the first byte, a third indicator in a second bit of each of a required number of subsequent bytes except for a fourth indicator in the second bit of a last required subsequent byte, and the digital value in remaining bits of the first byte and the required number of subsequent bytes if more than the remaining bits of the first byte are required to express the digital value, the required number of subsequent bytes being the number of subsequent bytes that are required to express the digital value.

21. The apparatus of claim 20, wherein the first bit is the least significant bit of the first byte, the remaining bits of the first byte are the most significant bits of the first byte, the second bit is the most significant bit of the subsequent bytes, and the remaining bits of the subsequent bytes are the least significant bits of the subsequent bytes.

22. The apparatus of claim 20, wherein the first indicator indicates that the digital value can be expressed in the first byte, the second indicator indicates that the digital value can not be expressed in the first byte, the third indicator indicates that at least one additional byte is required to express the digital value, and the fourth indicator indicates that no additional bytes are required to express the digital value.

23. An apparatus for encoding a digital value, the apparatus comprising:

a first processor for identifying a digital value that can be expressed in binary code;

a first storage device for storing a first indicator in a first bit of a first byte, a second indicator in a second bit of a second byte, and the digital value in remaining bits of the first byte and the second byte such that the digital value can be determined by reading the first byte and the second byte without by clearing any bits.

24. The apparatus of claim 23, wherein the first bit is the least significant bit of the first byte, the remaining bits of the first byte are the most significant bits of the first byte, the second bit is the most significant bit of the second byte, and the remaining bits of the second byte are the least significant bits of the second bytes.

25. The apparatus of claim 24, wherein the digital value is determined by shifting the most significant bits of the first byte and the least significant bits of the second byte by one bit.

26. The apparatus of claim 23, wherein the first indicator indicates that the digital value can not be entirely expressed in the first byte, and the second indicator indicates that no additional bytes are required to express the digital value.

27. An article of manufacture for encoding a digital value in an index of a database, the article of manufacture comprising:

a computer readable storage medium; and computer programming stored on the storage medium; wherein the stored computer programming is configured to be readable from the computer readable storage medium by a computer and thereby cause the computer to operate so as to:

identify a digital value representing a difference between a pair of entries in the database;

store a first indicator in a first bit of a first byte in the index and the digital value in remaining bits of the first byte if the digital value can be expressed in the remaining bits of the first byte; and store a second indicator in the first bit of the first byte in the index, a third indicator in a second bit of each of a required number of subsequent bytes in the index except for a fourth indicator in the second bit of a last required subsequent byte, and the digital value in remaining bits of the first byte and the required number of subsequent bytes if more than the remaining bits of the first byte are required to express the digital value, the required number of subsequent bytes being the number of subsequent bytes that are required to express the digital value.

28. The article of manufacture of claim 27, wherein the first indicator is a logical zero, the second indicator is a logical one, the third indicator is a logical one, and the fourth indicator is a logical zero.

29. The article of manufacture of claim 27, wherein the first bit is the least significant bit of the first byte in the index, the remaining bits of the first byte are the most significant bits of the first byte in the index, the second bit is the most significant bit of the subsequent bytes in the index, and the remaining bits of the subsequent bytes are the least significant bits of the subsequent bytes in the index.

30. The article of manufacture of claim 29, further causing the computer to operate so as to:

determine the digital value by shifting the most significant bits of the first byte in the index by one bit if the digital value can be expressed in the most significant bits of the first byte in the index.

31. The article of manufacture of claim 29, further causing the computer to operate so as to:

determine the digital value by shifting the most significant bits of the first byte in the index and the least significant bits of a second byte in the index by one bit if the digital value can be expressed in the most significant bits of the first byte in the index and the least significant bits of the second byte in the index.

32. The article of manufacture of claim 29, further causing the computer to operate so as to:

identify an initial value;

if the first byte in the index contains a logical zero in the least significant bit, determine a next value by adding the most significant bits of the first byte in the index to the initial value; and if the first byte in the index contains a logical one in the least significant bit, determine a next value by adding the most significant bits of the first byte in the index and the least significant bits of the required number of subsequent bytes in the index to the initial value.

33. An article of manufacture for encoding a digital value, the article of manufacture comprising:

a computer readable storage medium; and computer programming stored on the storage medium; wherein the stored computer programming is configured to be readable from the computer readable storage medium by a computer and thereby cause the computer to operate so as to:

identify a digital value that can be expressed in binary code;

store a first indicator in a first bit of a first byte and the digital value in remaining bits of the first byte if the digital value can be expressed in the remaining bits of the first byte; and store a second indicator in the first bit of the first byte, a third indicator in a second bit of each of a required number of subsequent bytes except for a fourth indicator in the second bit of a last required subsequent byte, and the digital value in remaining bits of the first byte and the required number of subsequent bytes if more than the remaining bits of the first byte are required to express the digital value, the required number of subsequent bytes being the number of subsequent bytes that are required to express the digital value.

34. The article of manufacture of claim 33, wherein the first bit is the least significant bit of the first byte, the remaining bits of the first byte are the most significant bits of the first byte, the second bit is the most significant bit of the subsequent bytes, and the remaining bits of the subsequent bytes are the least significant bits of the subsequent bytes.

35. The article of manufacture of claim 33, wherein the first indicator indicates that the digital value can be expressed in the first byte, the second indicator indicates that the digital value can not be expressed in the first byte, the third indicator indicates that at least one additional byte is required to express the digital value, and the fourth indicator indicates that no additional bytes are required to express the digital value.

36. An article of manufacture for encoding a digital value, the article of manufacture comprising:

a computer readable storage medium; and computer programming stored on the storage medium; wherein the stored computer programming is configured to be readable from the computer readable storage medium by a computer and thereby cause the computer to operate so as to:

identify a digital value that can be expressed in binary code;

store a first indicator in a first bit of a first byte, a second indicator in a second bit of a second byte, and the digital value in remaining bits of the first byte and the second byte such that the digital value can be determined by reading the first byte and the second byte without by clearing any bits.

37. The article of manufacture of claim 36, wherein the first bit is the least significant bit of the first byte, the remaining bits of the first byte are the most significant bits of the first byte, the second bit is the most significant bit of the second byte, and the remaining bits of the second byte are the least significant bits of the second bytes.

38. The article of manufacture of claim 37, wherein the digital value is determined by shifting the most significant bits of the first byte and the least significant bits of the second byte by one bit.

39. The article of manufacture of claim 36, wherein the first indicator indicates that the digital value can not be entirely expressed in the first byte, and the second indicator indicates that no additional bytes are required to express the digital value.

\* \* \* \* \*